US012683855B2

(12) United States Patent
Chappell et al.

(10) Patent No.: US 12,683,855 B2
(45) Date of Patent: Jul. 14, 2026

(54) HIGH RESOLUTION TIME DOMAIN REFLECTOMETRY (TDR) IN FAULT LOCATION MEASUREMENT IN A CABLE NETWORK

(71) Applicant: VIAVI SOLUTIONS INC., Chandler, AZ (US)

(72) Inventors: Daniel Keith Chappell, Greenwood, IN (US); Loren Eggert, Indianapolis, IN (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 581 days.

(21) Appl. No.: 18/114,673

(22) Filed: Feb. 27, 2023

(65) Prior Publication Data

US 2023/0269131 A1     Aug. 24, 2023

Related U.S. Application Data

(63) Continuation of application No. 15/964,890, filed on Apr. 27, 2018, now Pat. No. 11,621,884.
(Continued)

(51) Int. Cl.
*H04L 41/0677*          (2022.01)
*G01R 31/08*            (2020.01)
(Continued)

(52) U.S. Cl.
CPC .......... *H04L 41/0677* (2013.01); *G01R 31/08* (2013.01); *G01R 31/11* (2013.01); *H04B 3/46* (2013.01); *H04L 43/50* (2013.01)

(58) Field of Classification Search
CPC ..... H04L 41/0677; H04L 43/50; G01R 31/08; G01R 31/11; H04B 3/46
See application file for complete search history.

(56) References Cited

U.S. PATENT DOCUMENTS 5,272,439 A    12/1993  Mashikian et al.
5,352,984 A    10/1994  Piesinger et al.
(Continued)

FOREIGN PATENT DOCUMENTS

EP          2398148 A1    12/2011

OTHER PUBLICATIONS

"Time Domain Reflectometry Theory", Application Note, Agilent Technologies, May 31, 2013, USA, pp. 1-16.
(Continued)

*Primary Examiner* — Yossef Korang-Beheshti
(74) *Attorney, Agent, or Firm* — Mannava & Kang, P.C.

(57) ABSTRACT

A test instrument connectable to a cable television (CATV) network to provide a high resolution time domain reflectometry (TDR) in a fault location measurement is disclosed. The test instrument may have a port connectable to a test point in the CATV network. The test instrument may also have a processing circuit to perform a calibration measurement and a fault location measurement by, for the calibration measurement, transmitting frequency-chirped probe pulses into a closed calibration circuit within the test instrument, and receiving return signals at an analog-digital converter in the test instrument. The processing circuit may also resample the calibration measurement and the fault location measurement at a high sampling rate, cross-correlate the fault location with the calibration measurement to generate a cross-correlation TDR waveform, and generate a new TDR waveform using a refinement processing technique to remove echoes from the cross-correlation TDR waveform.

20 Claims, 33 Drawing Sheets

Related U.S. Application Data

(60) Provisional application No. 62/620,969, filed on Jan. 23, 2018.

(51) Int. Cl.
      *G01R 31/11*      (2006.01)
      *H04B 3/46*       (2015.01)
      *H04L 43/50*      (2022.01)

(56)                References Cited

U.S. PATENT DOCUMENTS

| | | | |
|---|---|---|---|
| 7,173,431 | B1 | 2/2007 | Lo et al. |
| 8,559,813 | B2 | 10/2013 | Harman |
| 9,414,126 | B1* | 8/2016 | Zinevich .................. H04B 3/46 |
| 9,838,679 | B2 | 12/2017 | Harris |
| 10,684,319 | B2 | 6/2020 | Berge et al. |
| 10,694,177 | B2 | 6/2020 | Harris |
| 2004/0022332 | A1 | 2/2004 | Gupta et al. |
| 2004/0044489 | A1 | 3/2004 | Jones |
| 2005/0234666 | A1 | 10/2005 | Taylor et al. |
| 2007/0110042 | A1 | 5/2007 | Li et al. |
| 2011/0211827 | A1 | 9/2011 | Soto et al. |
| 2012/0006117 | A1 | 1/2012 | Kordon et al. |
| 2014/0111184 | A1 | 4/2014 | Dalebroux |
| 2014/0161390 | A1 | 6/2014 | Winzer et al. |
| 2015/0009340 | A1 | 1/2015 | Chappell et al. |
| 2015/0009795 | A1 | 1/2015 | Gray et al. |
| 2015/0016816 | A1 | 1/2015 | Piehler |
| 2015/0020128 | A1 | 1/2015 | Maxson et al. |
| 2015/0020129 | A1 | 1/2015 | Chappell et al. |
| 2015/0139349 | A1 | 5/2015 | Hamzeh |
| 2016/0018443 | A1 | 1/2016 | Guenther |
| 2016/0112214 | A1 | 4/2016 | Currivan et al. |
| 2017/0023629 | A1 | 1/2017 | Berge et al. |
| 2017/0034507 | A1 | 2/2017 | Harris et al. |
| 2017/0104522 | A1* | 4/2017 | Zinevich .............. H04B 10/071 |
| 2017/0119325 | A1 | 5/2017 | Tamura |
| 2020/0249266 | A1* | 8/2020 | Jung ...................... G01R 31/11 |

OTHER PUBLICATIONS

Maxim, "MAX5878 16-Bit 250 Msps, High-Dynamic-Performance, Dual DAC with LVDS Inputs", Apr. 3, 2007, www. maxi mi nteg rated .com/en/products/analog/data-converters/dig ital-to-anal og-converters/MAX58 7 8. htm l (Year: 2007).

Maxim, "MAX5877 14-Bit, 250 Msps, High-Dynamic-Performance, Dual DAC with LVDS Inputs", Apr. 5, 2007, www. maxi mi nteg rated .com/en/products/analog/data-converters/dig ital-to-anal og-converters/MAX58 77. htm l (Year: 2007).

\* cited by examiner

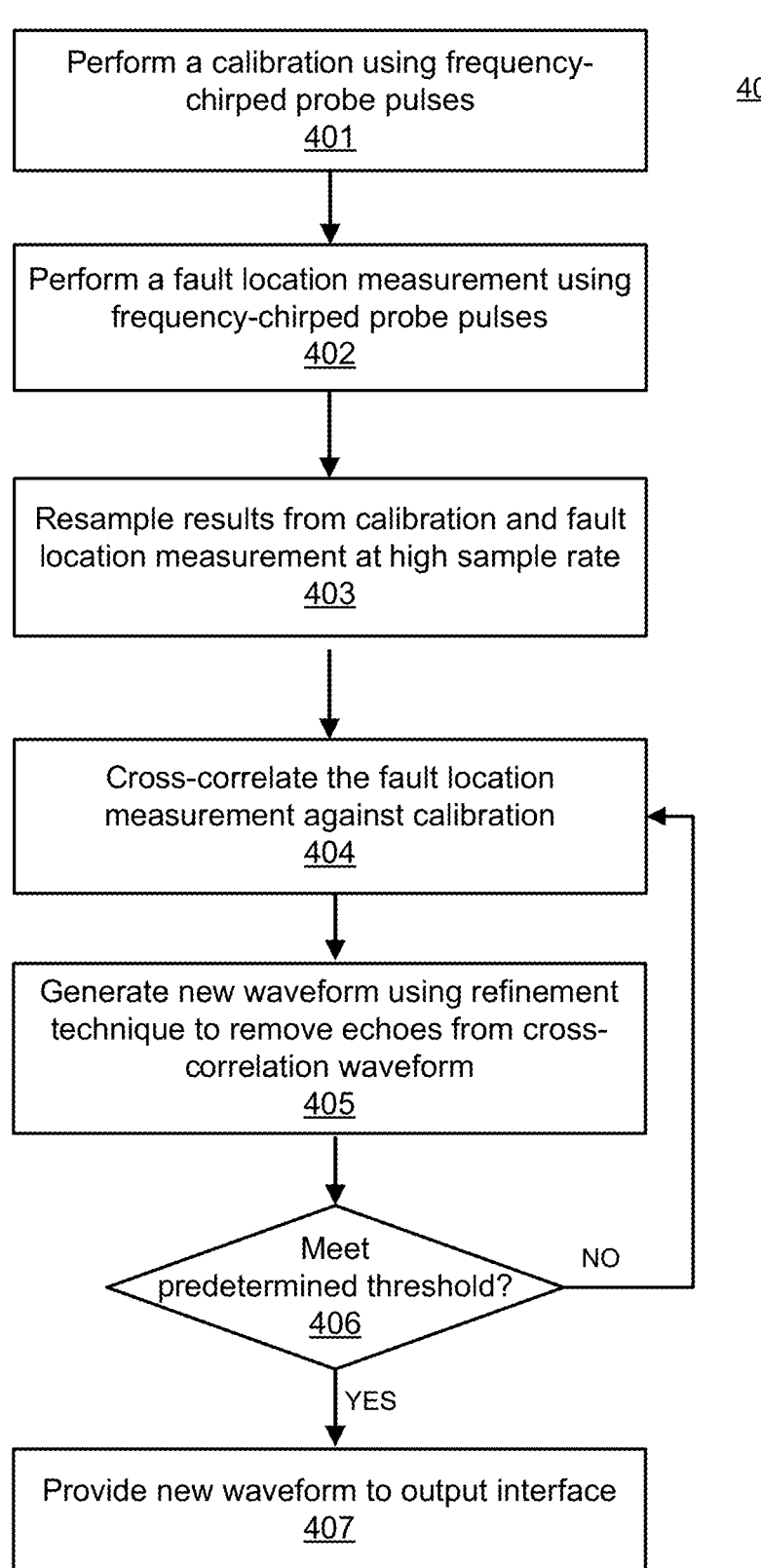

Perform a calibration using frequency-chirped probe pulses
401

Perform a fault location measurement using frequency-chirped probe pulses
402

Resample results from calibration and fault location measurement at high sample rate
403

Cross-correlate the fault location measurement against calibration
404

Generate new waveform using refinement technique to remove echoes from cross-correlation waveform
405

Meet predetermined threshold?
406

NO

YES

Provide new waveform to output interface
407

| Tap | 1st Leg | 2nd leg | Ttl Length |
|-----|---------|---------|------------|
| 1 | 303 | 15 | 318 |
| 2 | 303 | 10 | 313 |

Cable Type:    RG6   Longest Reflection:    314.7 ft
Cable VOP:    0.83
Cable Loss:    2.87 dB / 100 ft

| Reflection Distance (ft) | Return Loss (dBrl) |
|--------------------------|--------------------|
| 309.8 | -9.3 |
| 314.7 | -10.4 |

6.939          ft          339.700

| Tap | 1st Leg | 2nd leg | 3rd Leg | Ttl Length |
|---|---|---|---|---|
| 1 | 53 | 25 | 10 | 88 |
| 2 | 53 | 50 | 0 | 103 |
| 3 | 53 | 50 | 0 | 103 |

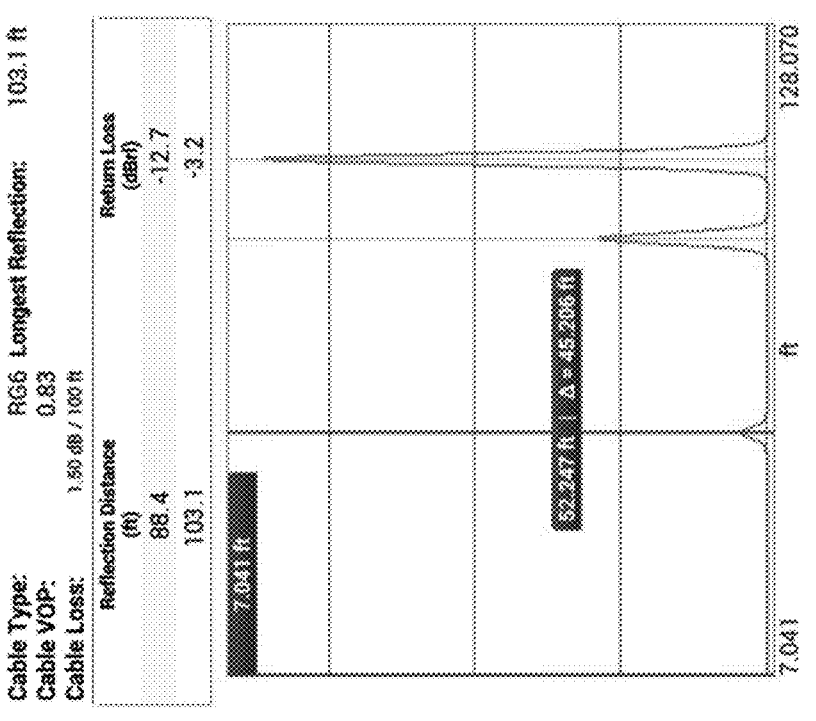
FIG. 6C
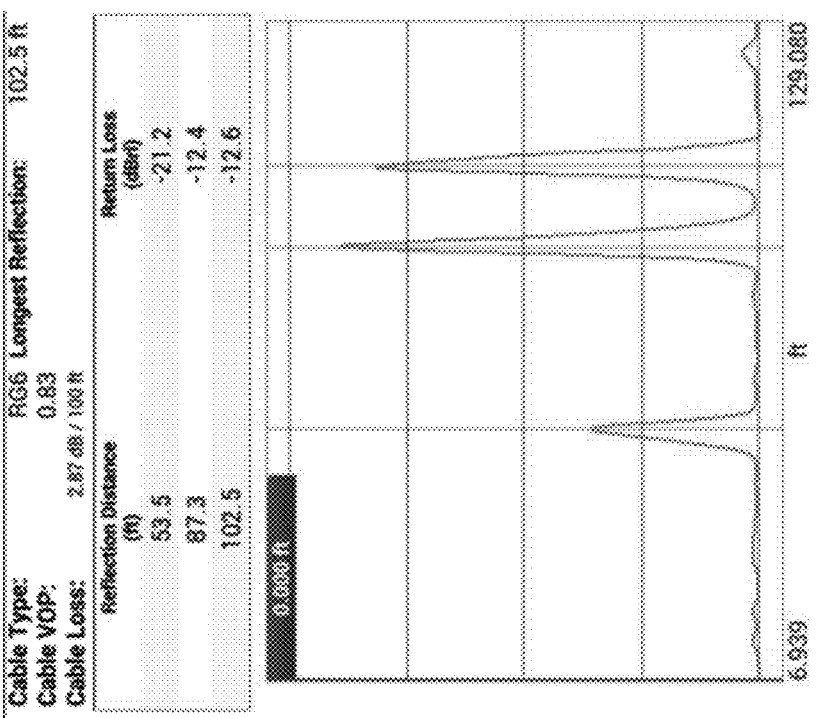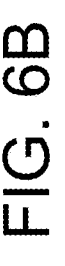
FIG. 6B

| Tap | 1st Leg | 2nd leg | 3rd Leg | Ttl Length |
|---|---|---|---|---|
| 1 | 53 | 25 | 20 | 98 |
| 2 | 53 | 25 | 30 | 108 |
| 3 | 53 | 25 | 30 | 108 |
| 4 | 53 | 50 | 0 | 103 |
| 5 | 53 | 50 | 0 | 103 |

Network 4: Master and 5 nodes; tap

| Tap | 1st Leg | 2nd leg | 3rd Leg | Ttl Length |
|---|---|---|---|---|
| 5 | 23 | 20 | 0 | 43 |
| 1 | 23 | 15 | 20 | 58 |
| 2 | 23 | 15 | 20 | 58 |
| 3 | 23 | 15 | 24 | 62 |
| 4 | 23 | 15 | 24 | 62 |

| Tap | 1st Leg | 2nd leg | 3rd Leg | Ttl Length |
|---|---|---|---|---|
| 1 | 23 | 30 | 16 | 69 |
| 2 | 23 | 30 | 17 | 70 |
| 3 | 23 | 30 | 18 | 71 |
| 4 | 23 | 15 | 19 | 57 |
| 5 | 23 | 15 | 20 | 58 |

Network 5: Master and 5 nodes; three splitters
Components A-C can be replaced with bad components

| Tap | 1st Leg | 2nd leg | 3rd Leg | 4th Leg | Ttl Length |
|---|---|---|---|---|---|
| 1 | 23 | 20 | 10 | 25 | 78 |
| 2 | 23 | 20 | 10 | 24 | 77 |
| 3 | 23 | 20 | 20 | 23 | 86 |
| 4 | 23 | 20 | 20 | 22 | 85 |
| 5 | 23 | 20 | 20 | 21 | 84 |

Network 6
Master and 6 nodes
Three passives deep

| Tap | 1st Leg | 2nd leg | 3rd Leg | Ttl Length |
|---|---|---|---|---|
| 1 | 23 | 132 | 10 | 165 |
| 2 | 23 | 132 | 20 | 175 |
| 3 | 23 | 132 | 30 | 185 |
| 4 | 23 | 132 | 40 | 195 |
| 5 | 23 | 25 | 0 | 48 |
| 6 | 23 | 80 | 0 | 103 |

4-way splitter 3-way unbalanced splitter

Network 7
Master and 6 nodes
Amplifier

| Tap | 1st Leg | 2nd leg | 3rd Leg | 4th Leg | Ttl Length |
|---|---|---|---|---|---|
| 10 | 23 | 6 | 10 | 0 | 39 |
| 3 | 23 | 3 | 0.5 | 15 | 41.5 |
| 2 | 23 | 3 | 1 | 15 | 42 |
| 4 | 23 | 3 | 0.5 | 20 | 46.5 |
| 1 | 23 | 3 | 1 | 20 | 47 |
| 8 | 23 | 3 | 1.5 | 20 | 47.5 |
| 9 | 23 | 6 | 20 | 0 | 49 |
| 5 | 23 | 3 | 25 | 0 | 51 |
| 7 | 23 | 3 | 1.5 | 30 | 57.5 |
| 6 | 23 | 3 | 1.5 | 60 | 87.5 |

Network 8
Master and 10 nodes
Poorly balanced

| Tap | 1st Leg | 2nd leg | 3rd Leg | Ttl Length |
|---|---|---|---|---|
| 1 | 11 | 50 | 0 | 61 |
| 2 | 11 | 20 | 0 | 31 |
| 3 | 11 | 132 | 10 | 153 |
| 4 | 11 | 132 | 20 | 163 |
| 5 | 11 | 132 | 30 | 173 |
| 6 | 11 | 132 | 40 | 183 |

Network 10
Master and 6 nodes
Two-way amplifier
MoCA filter

| Tap | 1st Leg | 2nd leg | 3rd Leg | Ttl Length |
|---|---|---|---|---|
| 1 | 15 | 30 | 20 | 65 |
| 2 | 15 | 30 | 30 | 75 |

Network 12
Master and 2 nodes
Splitter with 2 out of 3 legs unterminated

HIGH RESOLUTION TIME DOMAIN REFLECTOMETRY (TDR) IN FAULT LOCATION MEASUREMENT IN A CABLE NETWORK

PRIORITY

This patent application is a Continuation of co-pending U.S. patent application Ser. No. 15/964,890, filed Apr. 27, 2018, which claims priority of U.S. Provisional Patent Application No. 62/620,969 filed Jan. 23, 2018, the disclosures of which are hereby incorporated by reference in their entireties.

TECHNICAL FIELD

This patent application relates generally to testing and monitoring a cable network, and more specifically, to systems and methods for providing high resolution time domain reflectometry (TDR) in fault location measurement in a cable television (CATV) network.

BACKGROUND

A cable network can fail for a variety of reasons. In a cable television (CATV) network, signals are distributed via a fiber-optic connection from a headend to a node that converts the optical signal to an electrical signal and then distributes the signals to customer premises via a tree and branch coaxial cable distribution network, generally referred to as a "cable plant." At the customer premises, terminal equipment, such as cable modems, may support delivery of various downstream services. Upstream signals from the customer premises may propagate from branches of the cable plant towards the headend of the network. These upstream and downstream signals may be prone to defect or interference, which may be caused by varying sources originating at or near various locations in the network. Such defects, impairments, or other sources of interference, among other things, can negatively impact signal quality. It may be important to use a test instrument that can accurately and reliably locate the impairment or fault in order to ensure adequate network performance.

BRIEF DESCRIPTION OF DRAWINGS

Features of the present disclosure are illustrated by way of examples shown in the following figures. In the following figures, like numerals indicate like elements, in which:

FIG. 4 illustrates a method for measuring a fault location in a cable network, according to an example;

FIGS. 6A-6C illustrate a network configuration and measurement profiles for measuring a fault location in a cable network, according to an example;

DETAILED DESCRIPTION

Figure 1:
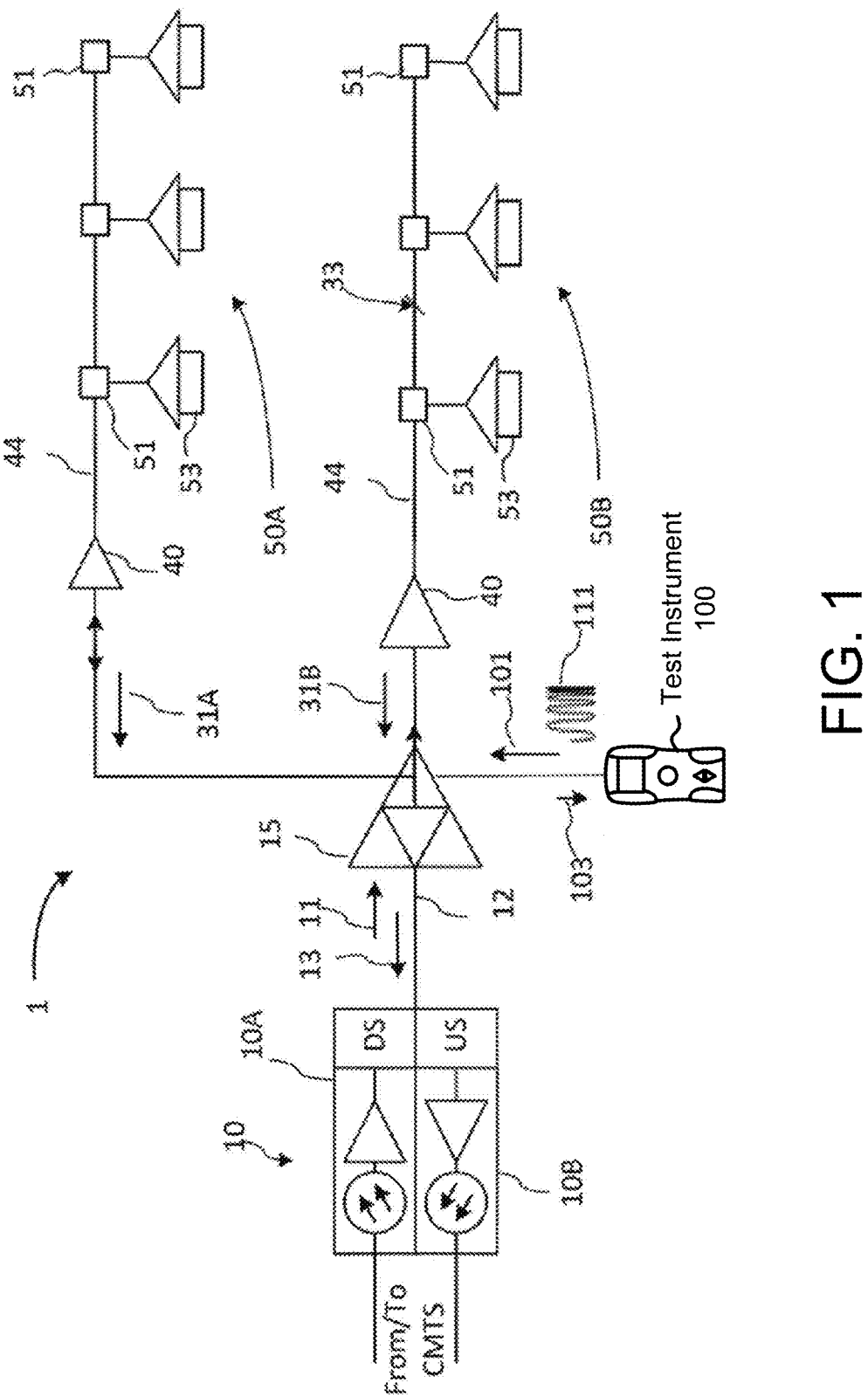
FIG. 1 illustrates a cable network, according to an example.

For simplicity and illustrative purposes, the present disclosure is described by referring mainly to examples thereof. In the following description, numerous specific details are set forth in order to provide a thorough understanding of the present disclosure. It will be readily apparent, however, that the present disclosure may be practiced without limitation to these specific details. In other instances, some methods and structures have not been described in detail so as not to unnecessarily obscure the present disclosure. Throughout the present disclosure, the terms "a" and "an" are intended to denote at least one of a particular element. As used herein, the term "includes" means includes but not limited to, and the term "including" means including but not limited to. The term "based on" means based at least in part on.

Service providers have recently begun to run optical fiber to customer premises to improve bandwidth. Providers of digital television (DTV) services, for example, typically use two-way hybrid fiber-coaxial (HFC) networks, which are shared bi-directional networks with point-to-multipoint transmission in the downstream direction using digital signals or a mix of analog and digital signals, and multipoint-to-point transmission in an upstream direction. As described above, signals may be distributed via a cable plant. At the customer premises, terminal equipment may support delivery of cable services, which may include video, data, and voice services, to subscribers via cable modems.

Delivery of data services over cable networks, and in particular cable television (CATV) networks, may typically be compliant with a Data Over Cable Service Interface Specifications (DOCSIS®) standard. The term "DOCSIS" generally refers to a group of specifications published by CableLabs that define industry standards for cable headend equipment, such as Cable Modem Termination System (CMTS), and cable modem (CM) equipment. The physical layer specification of DOCSIS may provide frequency multiplexing and several specific forms of quadrature amplitude modulation (QAM) for both upstream (e.g., CM to headend) and downstream (e.g., headend to CM) communications. Upstream and downstream signals may occupy separate frequency bands called upstream and downstream frequency bands.

Upstream and downstream signals may be prone to defects or impairments in the network. Because of the cable plant's "tree" structure, there may be numerous devices, cable segments, and connectors located between the fiber-optic node and an end user. As a result, there may be a plurality of locations where a defect or impairment may occur. In order to ensure adequate network performance, a cable plant may need to be regularly monitored and tested so that defects and impairments may be accurately identified and located.

In order to trace a defect or impairment, a technician may travel to different network locations and take and compare measurements. A portable network testing device or test instrument may be used to help to identify certain types of defects in the cable plant by performing specific spectral and noise measurements in the upstream and/or downstream directions using specialized testing techniques at localized or remote network locations. A number of tests or measurements may also be performed to evaluate quality of digital TV signal transmission on higher logical levels of data transmission. For example, these may include measuring carrier level or amplitude, modulation error ratio (MER), bit error rate (BER), ingress under carrier (IUC), and other values, signals, ratios, or parameters. These measurements may be performed on a channel-by-channel basis, where each channel diagnostic data may be summarized on a separate screen or data page viewed by a technician on a visual display of a test instrument or other computing device.

One type of defect that may be particularly hard to locate are defects that lead to changes in impedance along the signal path in the cable plant. For example, these defects may be caused by cable corrosion resulting from exposure to water, rodent chews, short-circuits, wear and tear, scratches, or other damage. Impedance changes may also be caused by set screws inside housings that become loose when under-torqued. It should be appreciated that set screws may be fasteners that typically connect a center conductor of the cable to internal circuits of amplifiers, splitters, taps, and/or fiber nodes. Impedance changes may also be caused by set screws that are over-torqued. Over-torqueing may trigger oxidation through a galvanic process that deteriorates a cable.

Defects of these types may be located using time domain reflectometry (TDR), which may include launching a short pulse into a cable and detecting reflections from location of impedance change, with a time delay between transmission and reflection indicating the distance to the fault. Conventional techniques using TDR, however, may require that service to customers be disconnected (out-of-service) during the measurements. Out-of-service testing is preferred because strong TDR pulses can interfere with the downstream TV signals at the end user locations, and weak reflected TDR pulses may subsequently be obscured by the upstream DTV signals from the end users. Disconnecting service, however, generally leads to customer dissatisfaction. As a result, service providers are generally reluctant to perform such TDR measurements. As described herein, systems and methods for providing high resolution TDR in measuring impedance changing faults in a CATV network without disconnecting service is provided.

It should be appreciated that the following abbreviations may be used herein: hybrid fiber-coaxial (HFC), local area network (LAN), application specific integrated circuit (ASIC), field programmable gate array (FPGA), digital signal processor (DSP), quadrature amplitude modulation (QAM), customer premise equipment (CPE), cable modem termination system (CMTS), radio frequency (RF), random access memory (RAM), analog to digital converter (ADC), digital to analog converter (DAC), as well as others. The term "packet" may refer to a unit of data forwarded between an origin and a destination in a network. Each packet typically includes a payload (e.g., carrying information) and headers (e.g., carrying meta-data) that can include various layers (e.g., sub-layer headers) of meta-data. In a general sense, a "channel" may refer to an information transfer path within a system (e.g., (Data-Over-Cable Service Interface Specifications (DOCSIS) networks), and the mechanism by which the path is created. Information may be transmitted over a channel with the help of a quadrature amplitude modulation (QAM) which refers to an analog radio frequency channel that uses QAM (e.g., a modulation technique in which an analog signal's amplitude and phase vary to convey information, such as digital data). A QAM channel may include single carrier QAM (SC-QAM) or a legacy DOCSIS 3.0 channel. Orthogonal frequency-division multiplexing (OFDM) may be used in a digital multi-carrier modulation method introduced in DOCSIS 3.1. As described here, systems and methods for in-service location of faults in a cable network using high resolution time domain reflectometry (TDR) with chirped TDR pulses may be provided.

FIG. 1 illustrates a cable network, according to an example. FIG. 1 depicts a cable network 1. The cable network 1 may be a CATV network, or other wired communications network. These may include, but not limited to, those using QAM formats, such as for example DVB-T based digital TV systems, OFDM-based networks, DSL networks, and other types of networks. The cable network 1 may be a local portion of an HFC network that delivers CATV signals to end users at a plurality of customer premises. These CATV signals may include digital TV signals, data and control signals, or other signals transmitted through the cable network 1.

As illustrated in FIG. 1, a fiber-optic node 10 of the cable network 1 may include a downstream (DS) optoelectronic converter 10A that converts downstream (DS) optical signals generated by a remote CMTS (not shown) into downstream electrical RF signals 11, and an upstream (US) electro-optic converter 10B that converts upstream (US) electrical RF signals 13 into US optical signals for upstream transmission to the remote CMTS. The fiber-optic node 10 may be coupled via a coaxial cable 12 to a bidirectional amplifier 15, which may amplify the downstream electrical RF signals 11 for distribution to first and second groups of homes 50A and 50B. The downstream electrical RF signals 11 generated by the downstream optoelectronic converter 10A of the fiber-optic node 10 may be distributed to a plurality of end-of-the-line subscribers (or end users) at customer premises 53 (e.g., homes of subscribers). These downstream electrical RF signals 11 may be transmitted via one or more trunk coaxial cables 44 and subscriber taps 51. At the customer premises 53, the downstream electrical RF signals 11 may be demodulated using cable modems (not shown). One or more two-way trunk RF amplifiers 40 may further be provided in each trunk coaxial cable 44 to amplify the upstream electrical RF signals 13 and downstream electrical RF signals 11 on to and from the customer premises 53. The first and second groups of homes 50A and 50B may send upstream signals 31A and 31B, respectively, which may be combined by the signal transmitter 110 into the upstream electrical RF signals 13 propagating towards the fiber node 106 for delivering to the remote CMTS at the headend (not shown).

Figure 2:
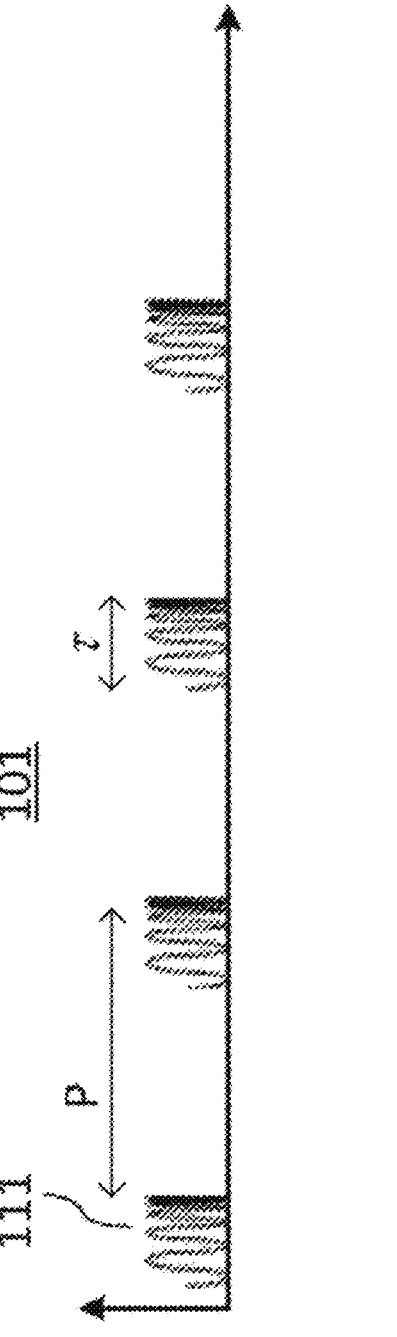
FIG. 2 illustrates chirped probe signal, according to an example.

A test instrument 100 may be connected to the cable network 1 at a desired test point where it may inject a probe signal 101 into the network in the downstream or upstream direction and receive back from the return signals 103. The probe signal 101 may, for example, include frequency-chirped probe pulses 111, as shown in FIG. 2. The test instrument 100, which may also be referred to as a tester or cable network testing device, may be configurable to for testing a signal path in the cable network 1, including measuring a location of a fault in the cable network 1 using high resolution TDR as described herein.

It should be appreciated that the cable network 1 may serve a large number of customer premises 53, which may be connected via subscriber taps 51 to a plurality of different trunk coaxial cables 44 at a plurality of different locations. The trunk coaxial cables 44 may be buried into the ground or they may be elevated above the ground on utility poles, or a combination of both. Because of exposure to various elements, all kinds of faults and defects 33 may occur anywhere in the cable network 1, resulting in in potential loss or reduced service to customer premises 53 among the second group of homes 50B. Among other things, such faults or defects 33 may be caused by kinks, breaks or rust in the coaxial cables, rusty or otherwise imperfect cable connections within various cable equipment along the signal path, etc. Such defects or impairments 33 may cause an abrupt change in the impedance along a signal propagation path in the network. Because these and other types of cable plant faults typically reflect back RF signals incident upon them, TDR principles and techniques may be used to discover and pinpoint impedance changes caused by these faults or defects 33.

TDR may be useful in detecting reflections from location of impedance change, with a time delay between transmission and reflection indicating a distance to the fault. For example, a test instrument 100 may transmit a short pulse of duration T along a signal transmission path. The test instrument 100 may then wait for any echoes or reflections of the pulse to return. Any reflected pulse may result from an impulse reflection from locations of the abrupt impedance change in the transmission line caused by a fault or defect. A distance-to-fault (DTF) expression, $l = v \cdot T/2$, may then be estimated by measuring the time T elapsed between the sending of an original pulse and reception of its echo based on an expected value v of the speed of propagation of the TDR pulse along the transmission path. A range resolution $\delta R \sim v\tau/2$ of this technique may be defined by pulse duration T, so that shorter pulses generally yield better resolution.

Figure 3:
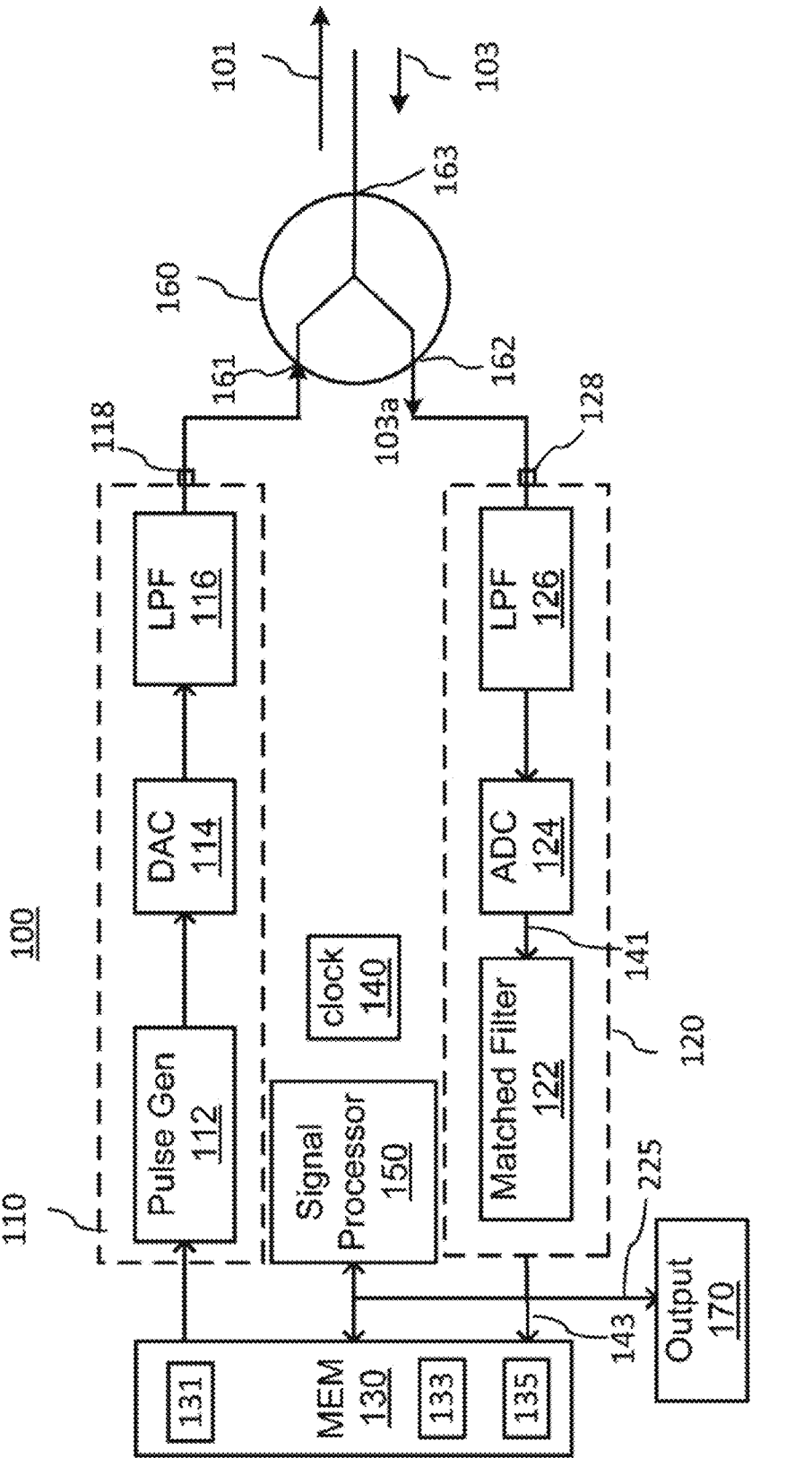
FIG. 3 illustrates a test instrument for measuring a fault location in a cable network, according to an example.

Although short pulses are generally high in energy and conventionally used for out-of-service testing, an improved TDR technique may be used for in-service measurements, as described herein. FIG. 3 illustrates a test instrument 100 for measuring a fault location in a cable network, according to an example. The test instrument 100 may transmit a pulsed probe signal 101 that is comprised of one or more frequency-chirped probe pulses 111 into a cable network 1, as shown in FIG. 2. The test instrument 100 may then monitor and look for a return signal 103 for echoes of these frequency-chirped probe pulses 111 that may originate from a network fault. The frequency chirped probe pulses 111 may be electrical pulses that are formed of an oscillatory electrical signal which oscillation frequency f is "swept," for example, continuously increased or decreased, in time during each pulse across a pre-defined frequency sweep band ($f_{max}$, $f_{min}$) between a minimum frequency $f_{min}$ and a maximum frequency $f_{max}$. The frequency sweep band ($f_{max}$, $f_{min}$) may also be referred to as the probe frequency band.

In an example, the test instrument 100 may be connected to cable network 1 in a manner allowing it to inject the frequency-chirped pulsed probe signal 101 into the downstream direction, and to receive the return signal 103 propagating in the upstream direction. The return signal 103 may generally include echoes or reflections of the probe signal 101 reflected from various locations in the network downstream from test instrument 100, and upstream signals generated by the end users. A benefit of using frequency-chirped probe pulses 111 for locating faults in an operational or in-service cable network is that the pulse energy may be spread over a comparatively longer time period, e.g., the pulse duration T, which may reduce power of the probe signal 101 and lessen interference with downstream signals for end users. It may also increase the signal-to-noise ratio (SNR) when detecting reflected echoes. It should be appreciated that frequency-chirped probe pulses 111 may also be referred to as the frequency swept (probe) pulses or probe pulses. In an example, the frequency f, which may also be referred to herein as the probe signal frequency, may be change linearly in time from $f_{min}$ to $f_{max}$ during the duration of the pulse, in which case the probe pulses 111 may be referred to as linearly frequency modulated (LFM) pulses or as the LFM TDR pulses. In other examples, dependence of the probe signal frequency on time f(t) within each probe pulse 111 may deviate from linearity. For example, as shown in FIG. 2, the pulsed probe signal 101 may be composed of a sequence of the frequency-swept probe pulses 111 of a pulse duration T and pulse period P.

The return signal 103 may be processed using a pulse compression technique based on a waveform of the probe pulse 111. This may enable a higher time-bandwidth product than for an equivalent CW pulsed signal. This may also result in an impulse signal that combines the higher signal-to-noise ratio (SNR) of a long duration pulse with the higher range resolution of the short pulse. The range, or distance-to-fault (DTF), resolution $\delta R$ of this TDR technique may then be estimated from the width $B = (f_{max} - f_{min})$ of the probe frequency band:

$$\delta R = v/(2B)$$

In an example, using chirped probe pulses 111 with B=80 MHz may yield a range (DTF) resolution of about 1.5 m, assuming $v \sim 0.85 \cdot c$, where c is the speed of light in vacuum.

Referring to FIG. 3, the test instrument 100 may be a cable network test device that uses TDR and provides a chirped-pulse to determine fault locations in the cable network 1. The test instrument 100 may include a signal transmitter 110 coupled to an output cable port 118 to transmit a signal to a signal entry 161 of element 160 to become the pulsed probe signal 101 at a signal entry/exit 163, and a signal receiver 120 coupled to an input cable port 128 to receive a return signal 103*a* via a signal exit 162 of element 160. The signal transmitter 110 may include a pulse generator 112 for generating the probe signal 101, which may be followed by a DAC 114 that may in turn be followed by an optional output filter 116. In one example, the optional output filter 116 may be a low-pass filter having a bandwidth B. The signal receiver 120 may include an optional input filter 126, which may be a low pass filter having a same, similar, or different bandwidth as that of the output filter 116. The optional input filter 126 may be followed by an ADC 124, and an output 141 of the ADC 124 is passed to a matched filter 122. A memory 130, including one or more memory units 131, 133, and 135, may further be provided and may be operatively coupled to the pulse generator 112 and the matched filter 122. A signal processor 150 (e.g., a return signal processor (RSP)), communicative coupled to a clock 140, may be coupled to the memory 130 and config-ured for processing the return signal 143 after it has passed the matched filter 122, which may include processing the return signal 143 for presenting to a viewer in a form suitable for extracting ranging information therefrom, iden-tifying locations of possible faults in the cable plant, and estimating the DTF. An output 170, such as a visual display, may communicate with the signal processor 150 to output processing results, for example on the visual display.

The signal processor 150, pulse generator 112, and matched filter 122 may each be a single dedicated processor or may collectively be a shared hardware processor or using multiple hardware processors, and/or a combination of soft-ware and digital hardware. Examples of hardware proces-sors that may be used to implement the pulse generator 112, matched filter 122, and signal processor 150 include a microcontroller, digital signal processor (DSP), application specific integrated circuit (ASIC), field programmable gate array (FPGA), network processor, system on a chip such as an FPGA with integrated ARM or microprocessor, complex programmable logic device (CPLD), erasable program-mable logic device (EPLD), simple programmable logic device (SPLD), macrocell array, discrete gate or transistor logic, discrete hardware components, or any combination thereof designed to perform the functions and methods described herein. In an example, one or more of the func-tions and operations of the test instrument 100 described herein may be performed by processing circuitry or other hardware executing machine readable instructions stored in a non-transitory computer readable medium, which may comprise RAM (random access memory), ROM (read only memory), EPROM (erasable, programmable ROM), EEPROM (electrically erasable, programmable ROM), hard drives, flash memory, or other types of storage devices, which may be volatile and/or nonvolatile.

The test instrument 100 may include components other than what is shown. For example, the test instrument 100 may include a telemetry interface (not shown) for connect-ing to a telemetry channel, such as a WiFi interface, Blu-etooth interface, cellular interface or another network inter-face. The test instrument 100 may connect to a remote device via the telemetry interface. The test instrument 100 may also include a user interface having a physical or virtual keypad and/or display. A user may interact with the test instrument 100, such as to enter information, select opera-tions, view measurements, view interference profiles, etc., via the user interface. The test instrument may also include one or more additional data storage, transmission circuits, and/or processing elements.

FIG. 4 illustrates a method for measuring a fault location in a cable network, according to an example. The method 400 is provided by way of example, as there may be a variety of ways to carry out the method described herein. Although the method 400 is primarily described as being performed by signal processor 150 of the test instrument 100, the method 500 may be executed or otherwise performed by one or more processing components of the test instrument 100, or by another system or a combination of systems. Each block shown in FIG. 4 may further represent one or more pro-cesses, methods, or subroutines, and one or more of the blocks may include machine readable instructions stored on a non-transitory computer readable medium and executed by a processor or other type of processing circuit to perform one or more operations described herein.

At block 401 in the method 400, the test instrument 100 may perform a calibration. The calibration may include transmitting frequency-chirped probe pulses 111 into a closed calibration circuit. In an example, the frequency-chirped probe pulses 111 may be transmitted between 4-110 MHz at a sample rate of 250 MSPS. For calibration, the probe signal 101 may be transmitted in the closed calibration circuit and the echo or return signal 103 may be received at an ADC 124 of the test instrument 100. Calibration results may be stored in memory 130 at the test instrument 100 or other location local or remote to the test instrument 100.

At block 402, the test instrument 100 may perform a fault location measurement. The fault location measurement may include transmitting frequency-chirped probe pulses 111 into a network under test, e.g., the cable network 1. Similar to the calibration, the frequency-chirped probe pulses 111 may be transmitted between 4-110 MHz at a sample rate of 250 MSPS. For fault location measurement, the probe signal 101 may be transmitted or injected into the cable network 1 and the echo or return signal 103 may be received at an ADC 124 of the test instrument 100. Results from the fault location measurement may be stored in memory 130 at the test instrument 100 or other location local or remote to the test instrument 100. It should be appreciated that other pulse rates and/or sampling rates for calibration and fault location measurements may be specified, depending on various con-figurations or elements used, such as filter passbands, mea-suring device capabilities, etc. In one example, the fre-quency-chirped probe pulses 111 may be transmitted between 4-204 MHz at a sample rate of 250 MSPS (e.g., for a measurement device that used a filter that could sweep between 4-204 MHz), for both calibration and fault location measurement, which in some implementations may allow for better differentiation between multiple reflections, namely ones that are closer in distance.

At block 403, the signal processor 150 of the test instru-ment 100 may resample the calibration and the fault location measurement at a higher rate. For example, results from the calibration and the fault location measurement may be resampled by a factor of 16, e.g., at 4 GHz or 4 GSPS. A filter may also be used in resampling to eliminate or reduce artifacts.

At block 404, the signal processor 150 may cross-corre-late the results of the fault location measurement at the higher rate against the results of the calibration at the higher rate. Cross-correlation is a measure of similarity of two series as a function of the displacement of one relative to the other. Cross-correlation may be used to detect similarities or differences between signals. In this example, the cross-correction values may be used to more accurately identify fault location measurements in frequency spectrum data. For instance, cross-correlating the results of the fault location measurement at the higher rate against the results of the calibration at the higher rate may help determine time delay between the two signals. Cross-correlation calculations may be performed in a frequency domain by a cross-correlation function well-known in the art. A cross-correlation technique for TDR that may also be used is described by Harris et al. in U.S. Pat. No. 9,385,679, which is hereby incorporated by reference. It should be appreciated that a number of various cross-correlation techniques may also be applied. Once cross-correlation calculations are made, a maximum of the cross-correlation function may indicate a point in time where the signals are best aligned. A cross-correlation frequency spectrum or waveform may be produced for further processing.

At block 405, the signal processor 150 may process the frequency spectrum or waveform from the cross-correlation to remove or reduce undesirable echoes and yield a higher resolution TDR. This may be involve generating a new TDR waveform using a refinement processing technique to remove echoes from the cross-correlation TDR waveform. Specifically, the signal processor 150 may identify a highest peak in the cross-correlation frequency spectrum or waveform and determine a time value and an amplitude of that highest peak. The signal processor 150 may take the time that corresponds with the highest peak and use it as delay factor. The signal processor 150 may delay the calibration measurement by the delay factor. The signal processor 150 may take the amplitude that corresponds with the highest peak and scale the delayed calibration measurement by −1× of the amplitude from the fault location measurement. By scaling the delayed calibration measurement, the echo or reflection may be removed (by addition or subtraction) from the fault location measurement. It should be appreciated that the delay may be proportional to distance to fault and the amplitude may be proportional to the dBrl (dB return loss).

At block 406, the signal processor 150 may determine whether the new cross-correlation frequency spectrum or waveform meets a predetermined threshold. If the waveform does not meet the predetermined threshold, the echo or reflection cancelled fault location measurement may be returned to blocks 404 and 405 for further processing and refinement. It should be appreciated that the predetermined threshold may be configurable. For example, the predetermined threshold may be set or customized high enough to obtain points of interest. In one example, the predetermined threshold may be set to −33 dBrl. Other various settings and configurations may also be provided.

At block 407, if the waveform does meet the predetermined threshold, the signal processor 150 may provide output results via the output 170. It should be appreciated that output results may include graphical data or other representation of data. Output results may or may not include cross-correlation calculations. In one example, the new TDR waveform resulting from the fault location measurement via the refinement processing technique may be outputted. It should be appreciated that the new TDR waveform may provide a high resolution profile that is more accurately and reliably indicative of potential fault location in cable network. Alternatively, if a reflection is not greater than the predetermined threshold value, the output results may include an output trace that may be generated based on the delay and amplitude of all echoes or reflections of interest during the iterative process described above.

Figure 5A:
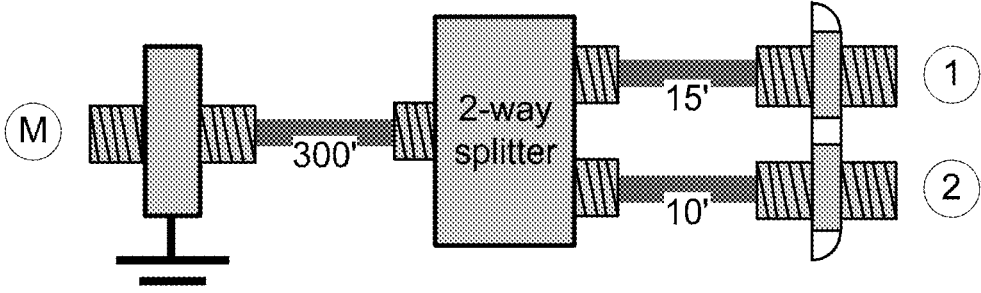
FIGS. 5A-5D illustrate a network configuration and measurement profiles for measuring a fault location in a cable network, according to an example.
Figure 5B:
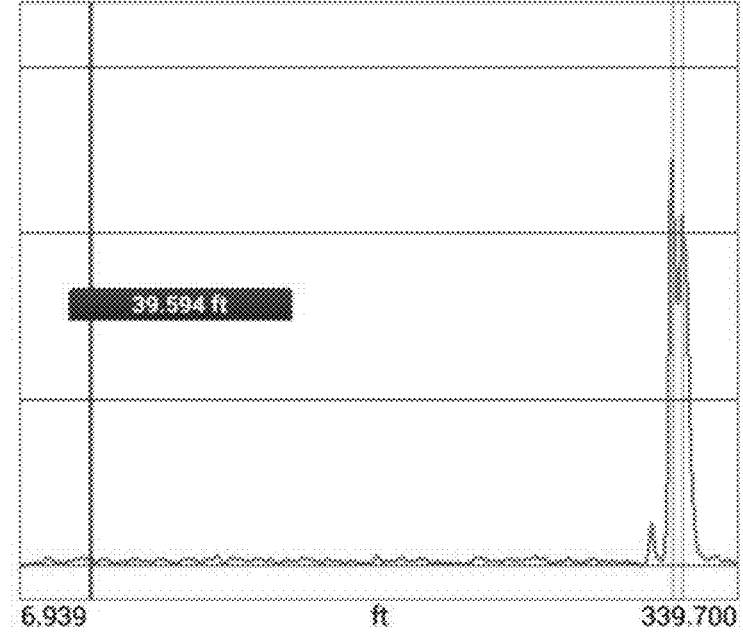

FIGS. 5A-5D illustrate a network configuration and measurement profiles for measuring a fault location in a cable network, according to an example. In FIG. 5A, a network configuration having a 300 ft. cable connected to a 2-way splitter is shown. The 2-way splitter is connected to a first tap via a 15 ft. cable and to a second tap via 10 ft. cable. FIG. 5B illustrates a TDR waveform generated by an out-of-service measurement device. In FIG. 5B, the reflection distance shows a reflection distance of 309.8 ft. and 314.7 ft., which are very close to the actual distances of 310 ft. and 315 ft., respectively.

Figure 5D:
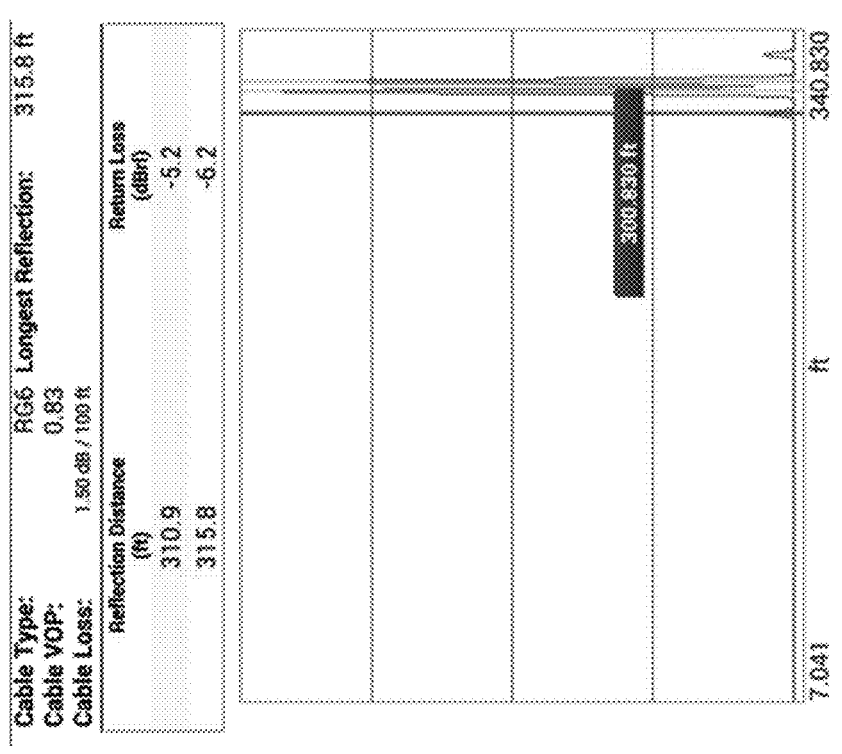
Figure 5C:
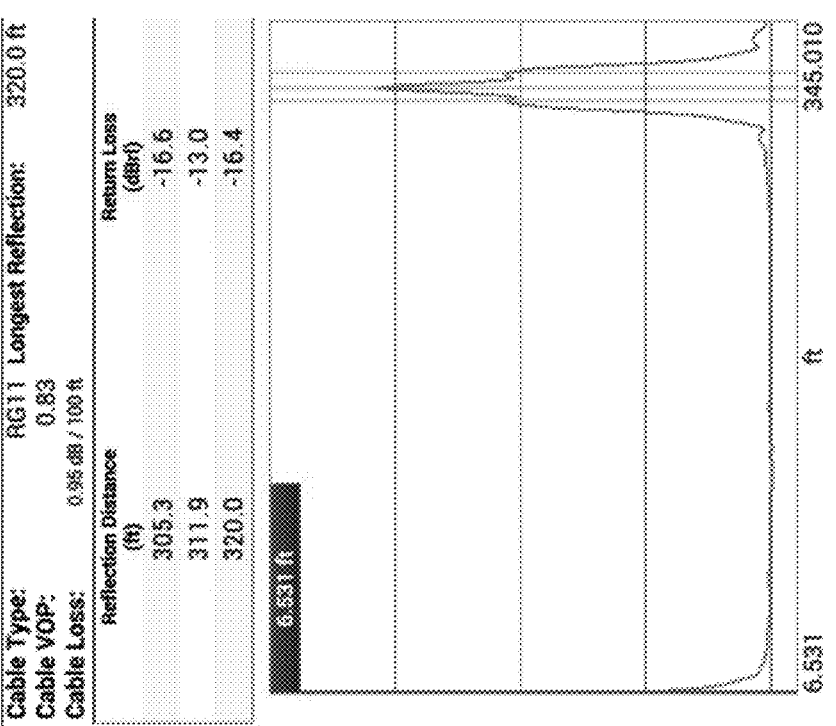
Figure 6A:
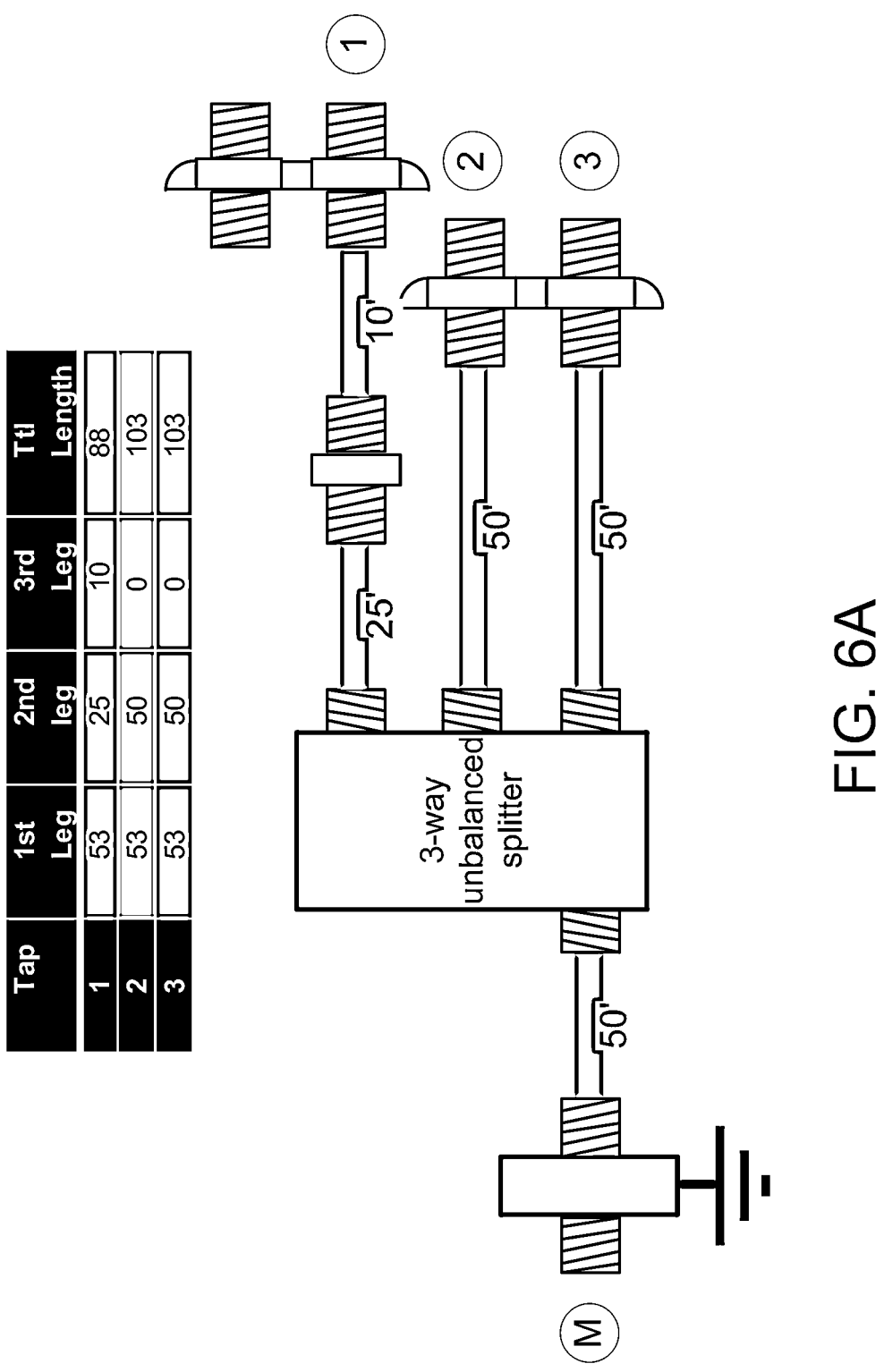
Figure 7A:
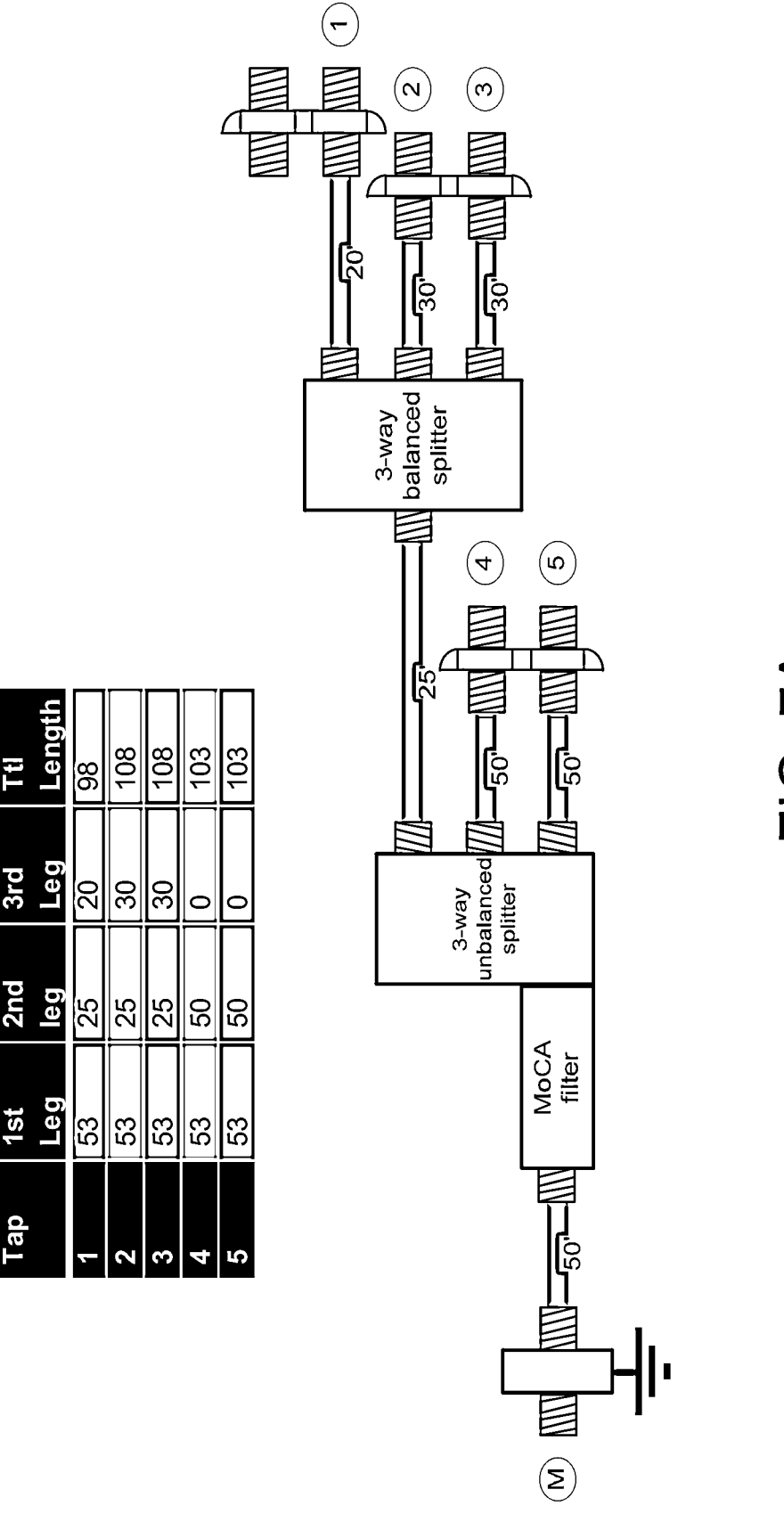
FIGS. 7A-7C illustrate a network configuration and measurement profiles for measuring a fault location in a cable network, according to an example.
Figure 7C:
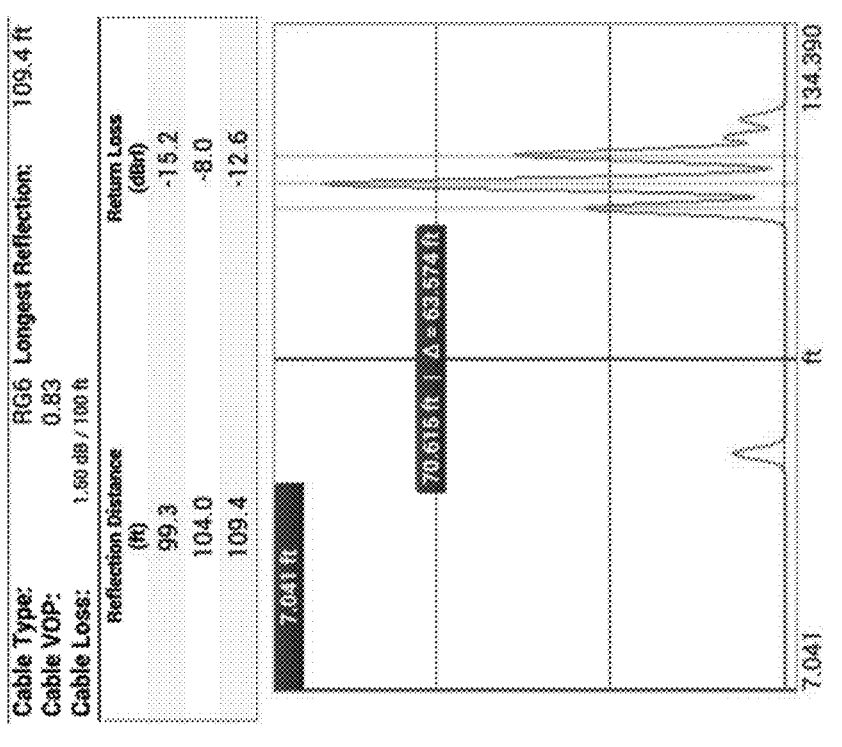
Figure 7B:
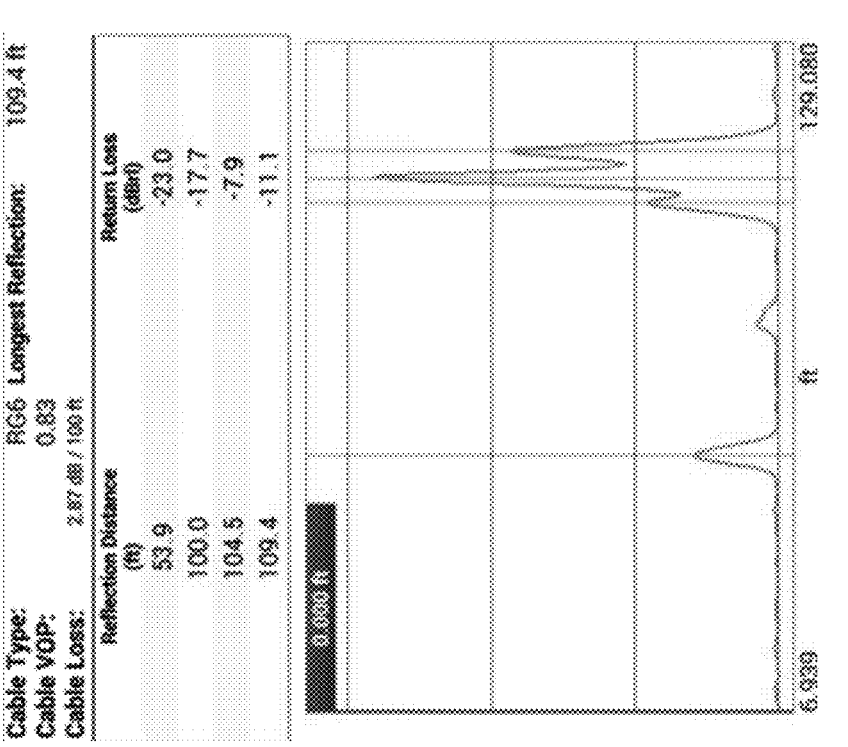
Figure 8A:
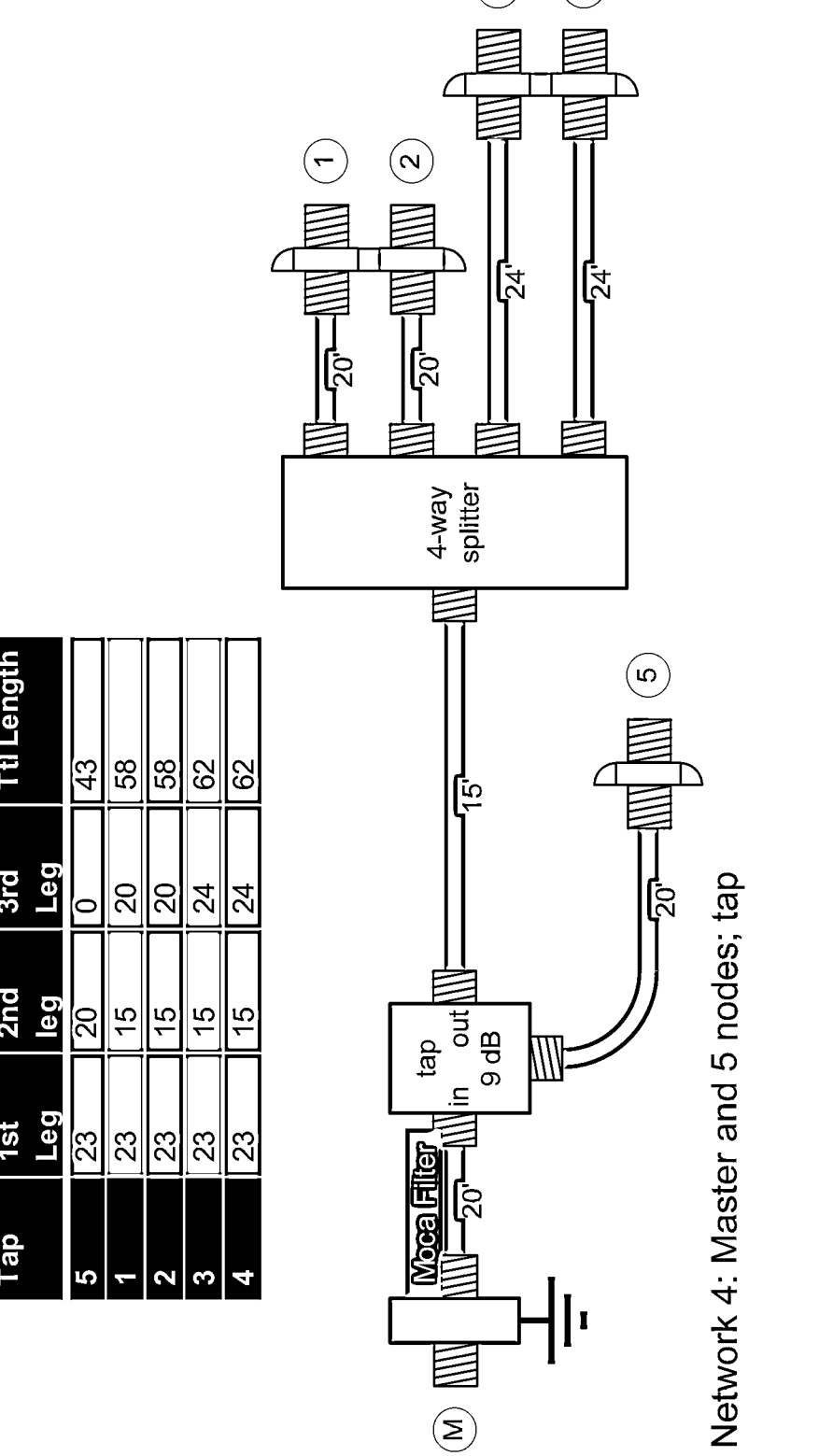
FIGS. 8A-8C illustrate a network configuration and measurement profiles for measuring a fault location in a cable network, according to an example.
Figure 8C:
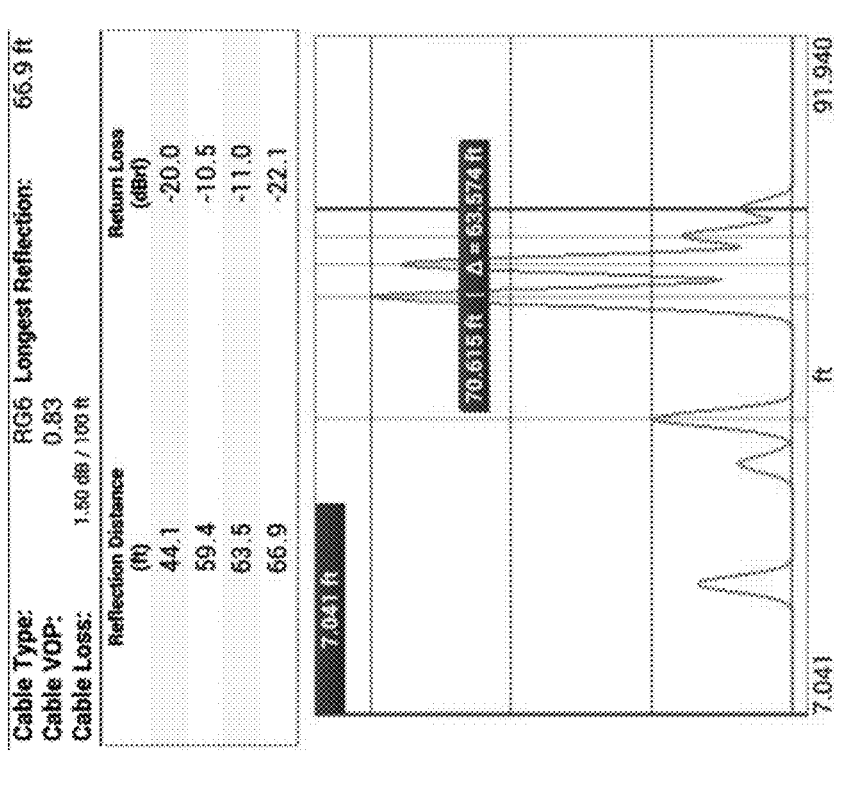
Figure 8B:
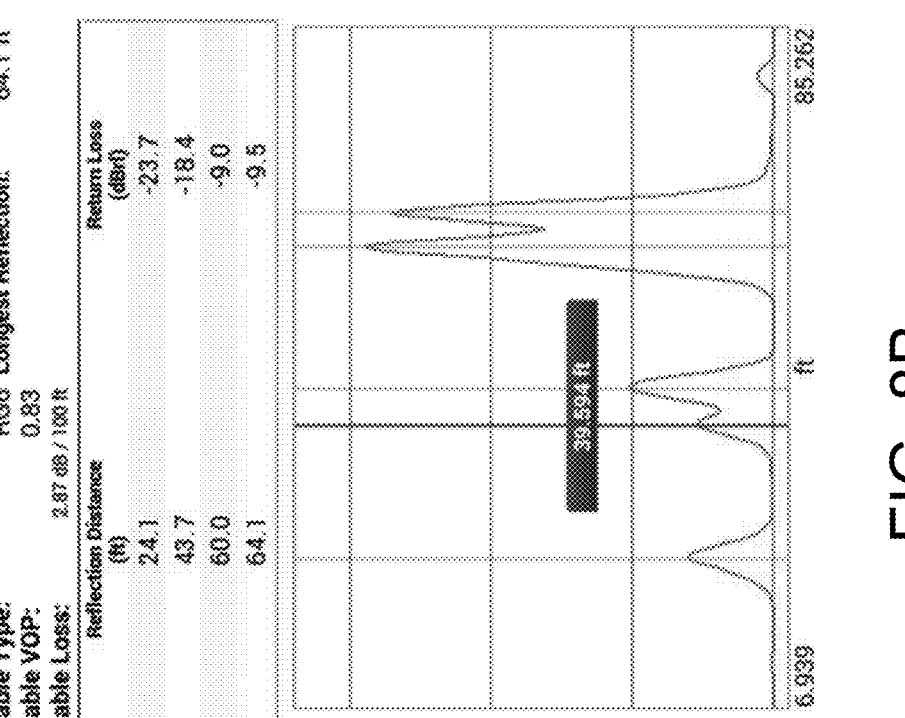
Figure 9A:
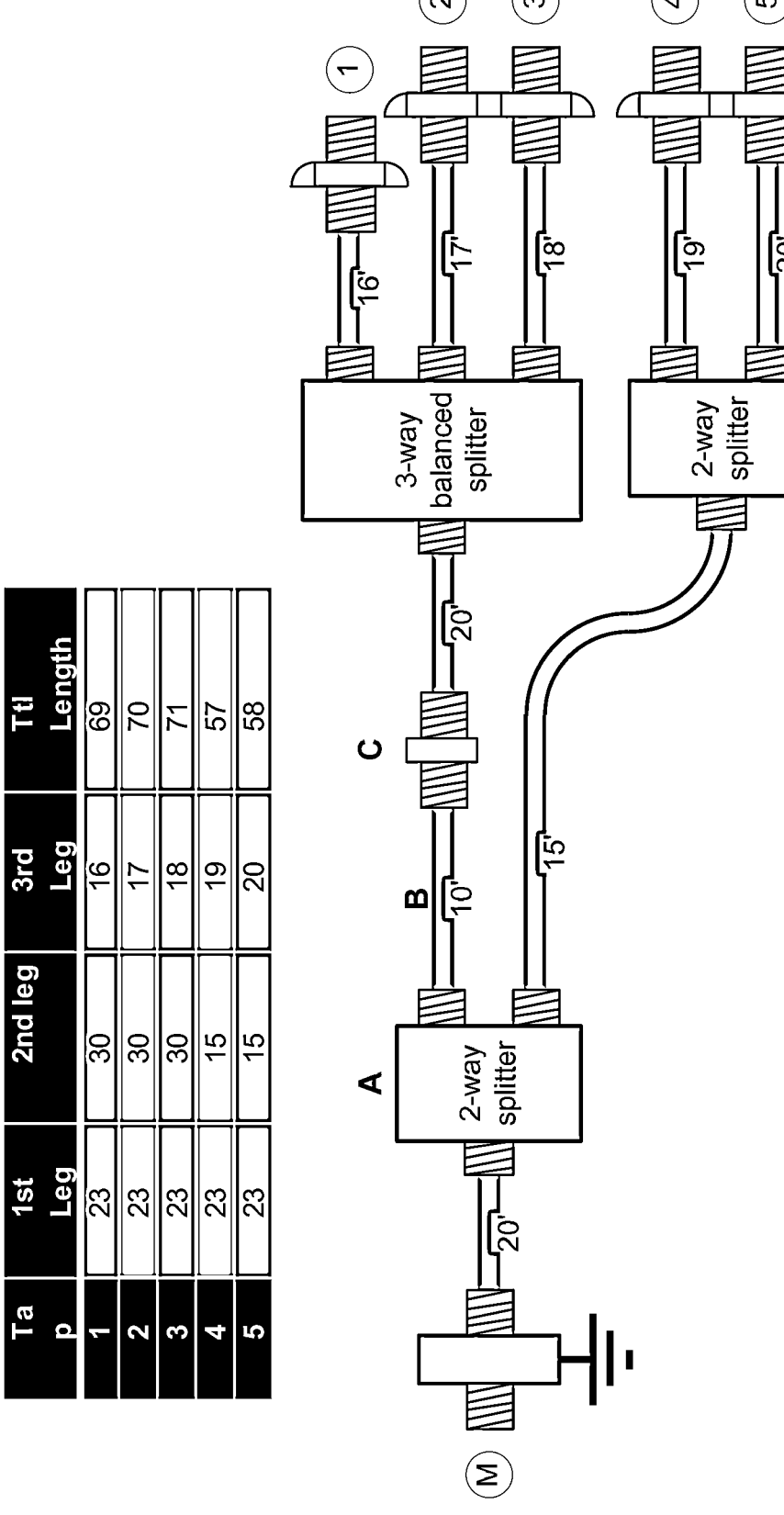
FIGS. 9A-9C illustrate a network configuration and measurement profiles for measuring a fault location in a cable network, according to an example.
Figure 9C:
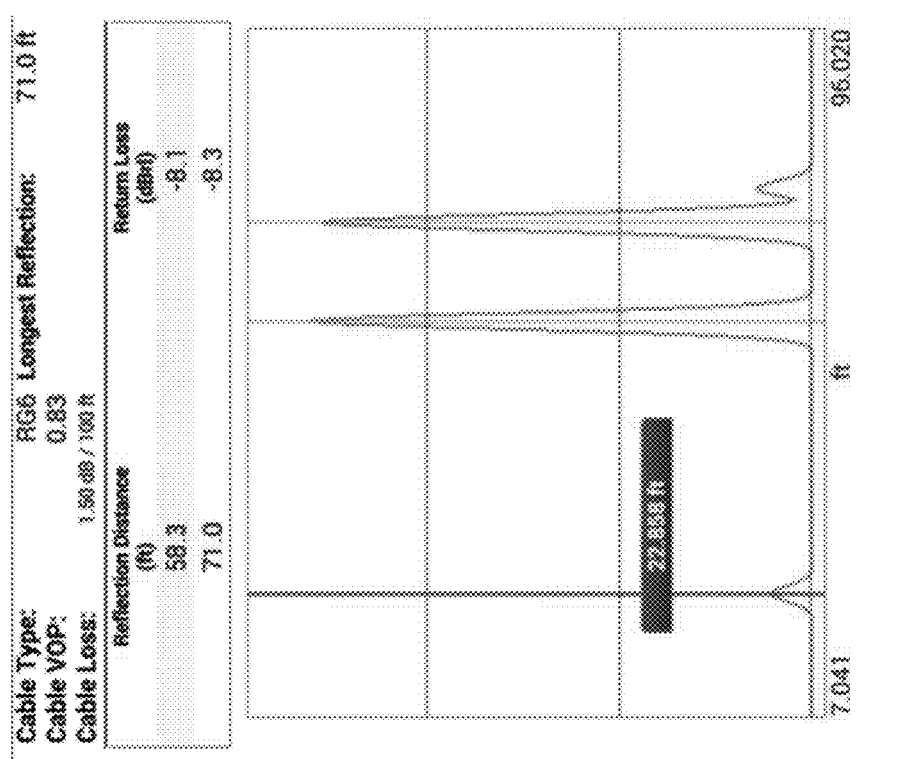
Figure 9B:
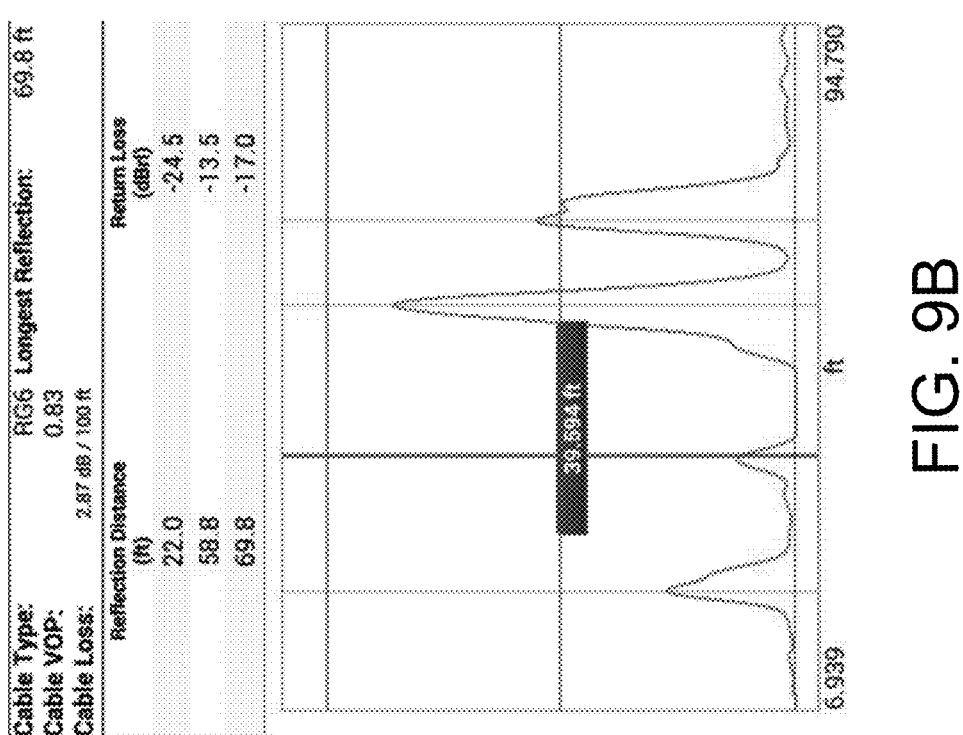
Figure 10A:
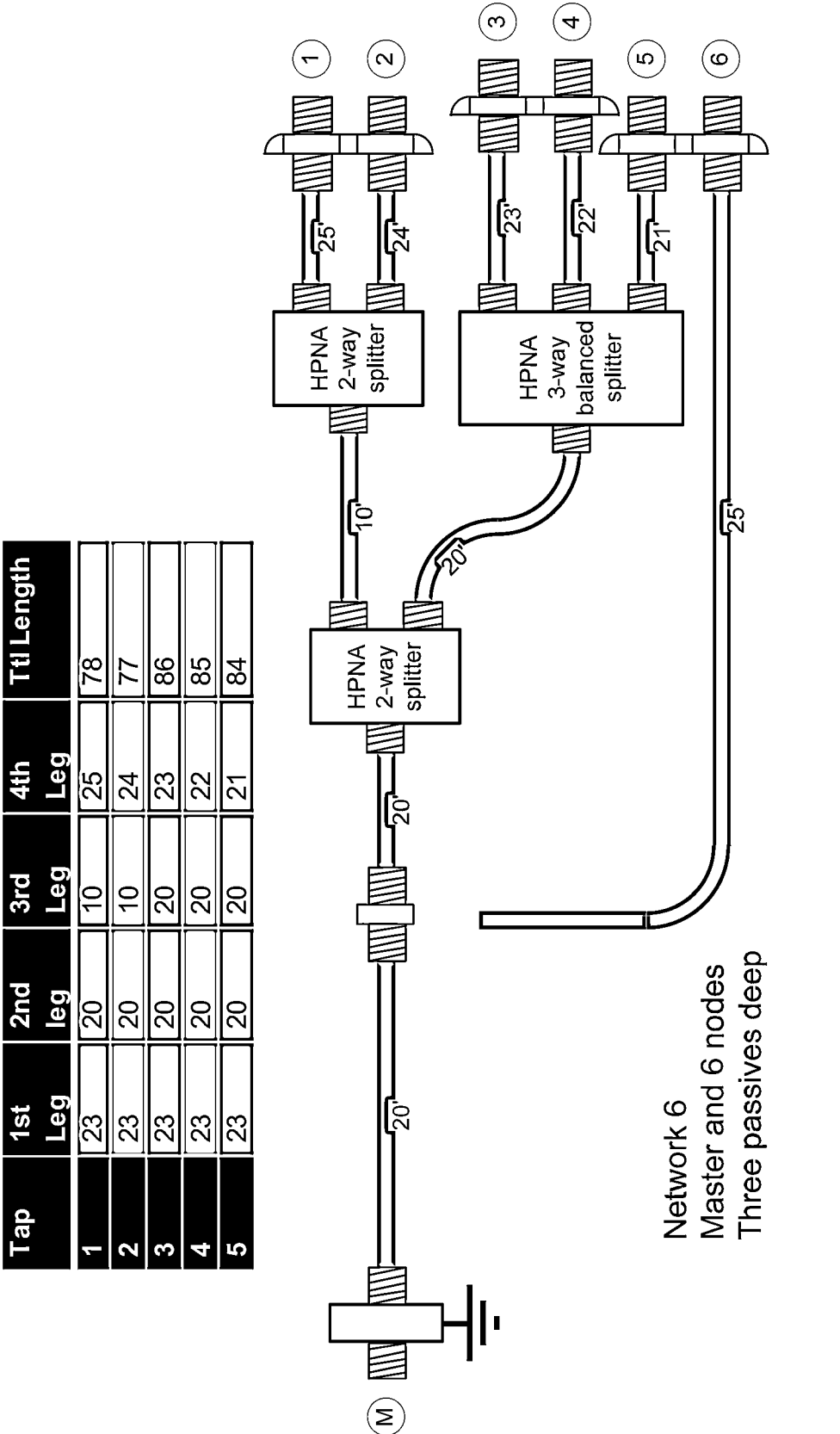
FIGS. 10A-10C illustrate a network configuration and measurement profiles for measuring a fault location in a cable network, according to an example.
Figure 10C:
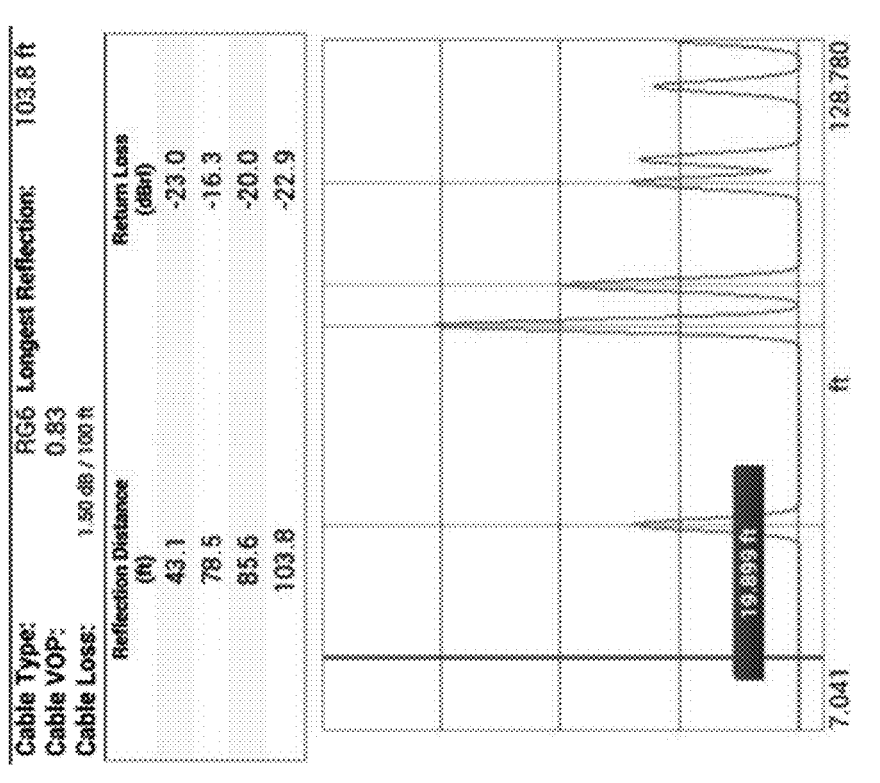
Figure 10B:
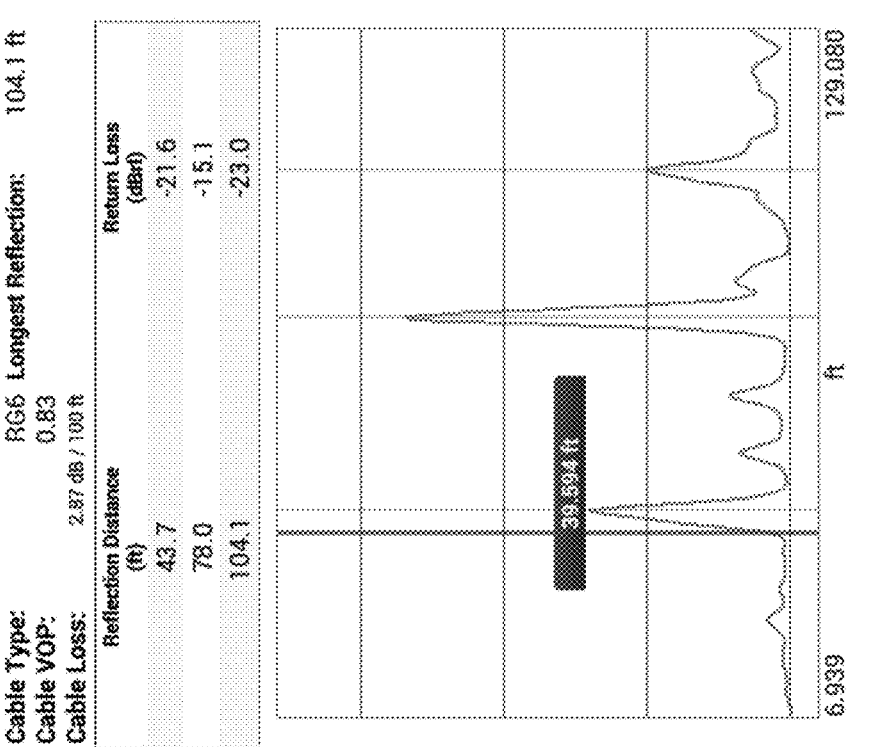

FIG. 5C illustrates a TDR waveform using a conventional processing technique for in-service measurements in the same network configuration of FIG. 5A. Here, the reflection distance is determined to be 305.3 ft., 311.9 ft., and 320.0 ft. FIG. 5D illustrates a TDR waveform using the high resolution processing techniques described herein for in-service measurements in the same network configuration of FIG. 5A. Here, the reflection distances are determined to be 310.9 ft. and 315.8 ft. The TDR waveform of FIG. 5D is more aligned with the out-of-service measurements and actual distances, when compared to that of FIG. 5C using conventional processing techniques.

Figure 17B:
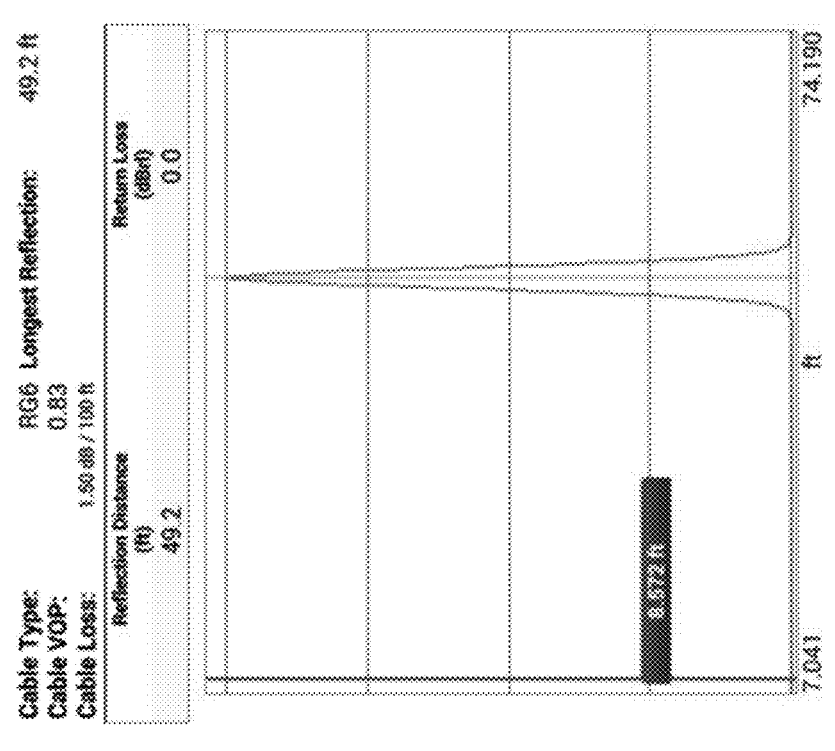
FIGS. 17A-17B illustrate a network configuration and measurement profiles for measuring a fault location in a cable network, according to an example.
Figure 17A:
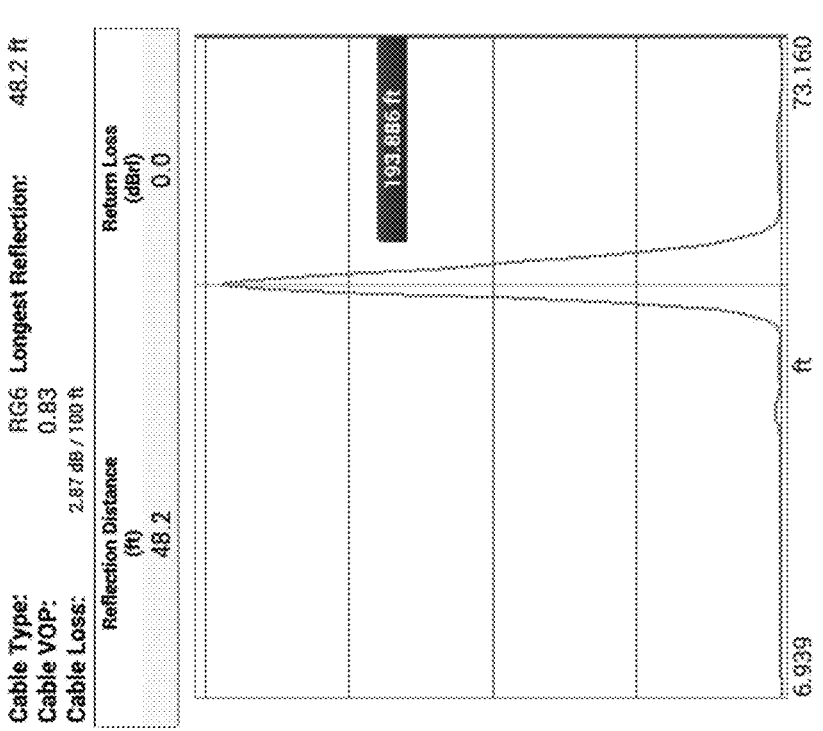
Figure 18B:
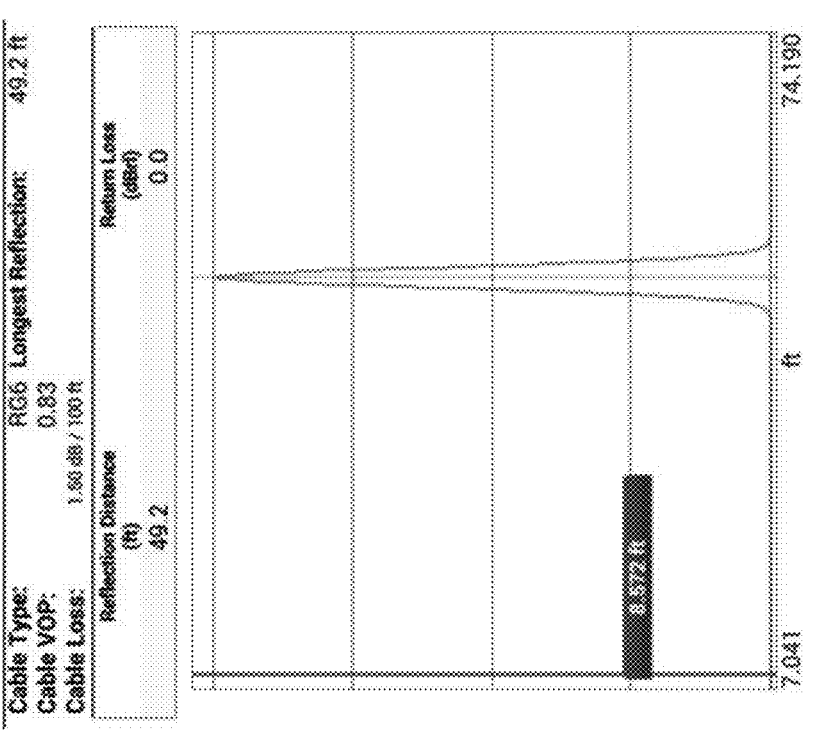
FIGS. 18A-18B illustrate a network configuration and measurement profiles for measuring a fault location in a cable network, according to an example.
Figure 18A:
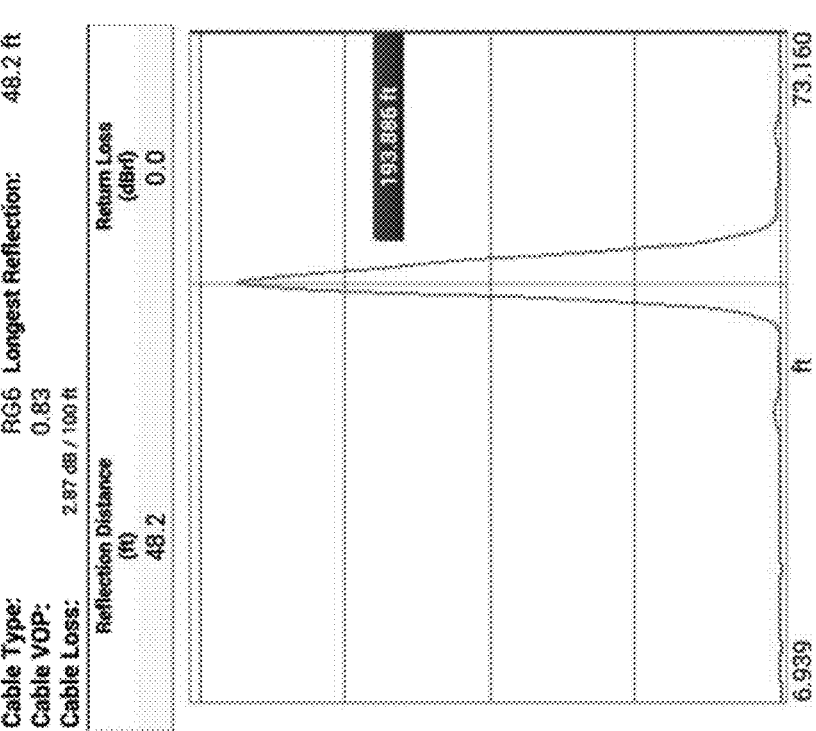
Figure 19B:
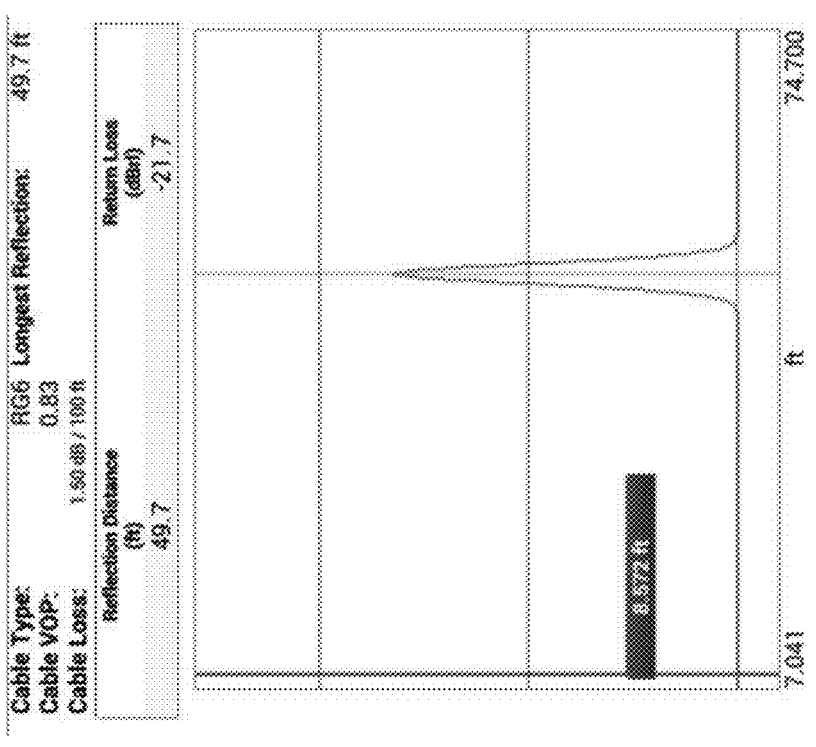
FIGS. 19A-19B illustrate a network configuration and measurement profiles for measuring a fault location in a cable network, according to an example.
Figure 19A:
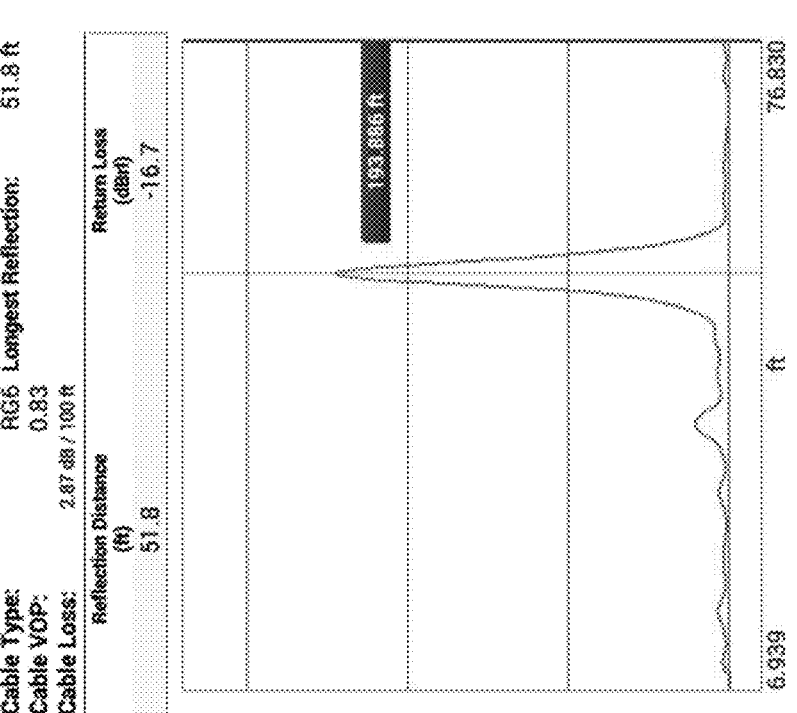
Figure 20A:
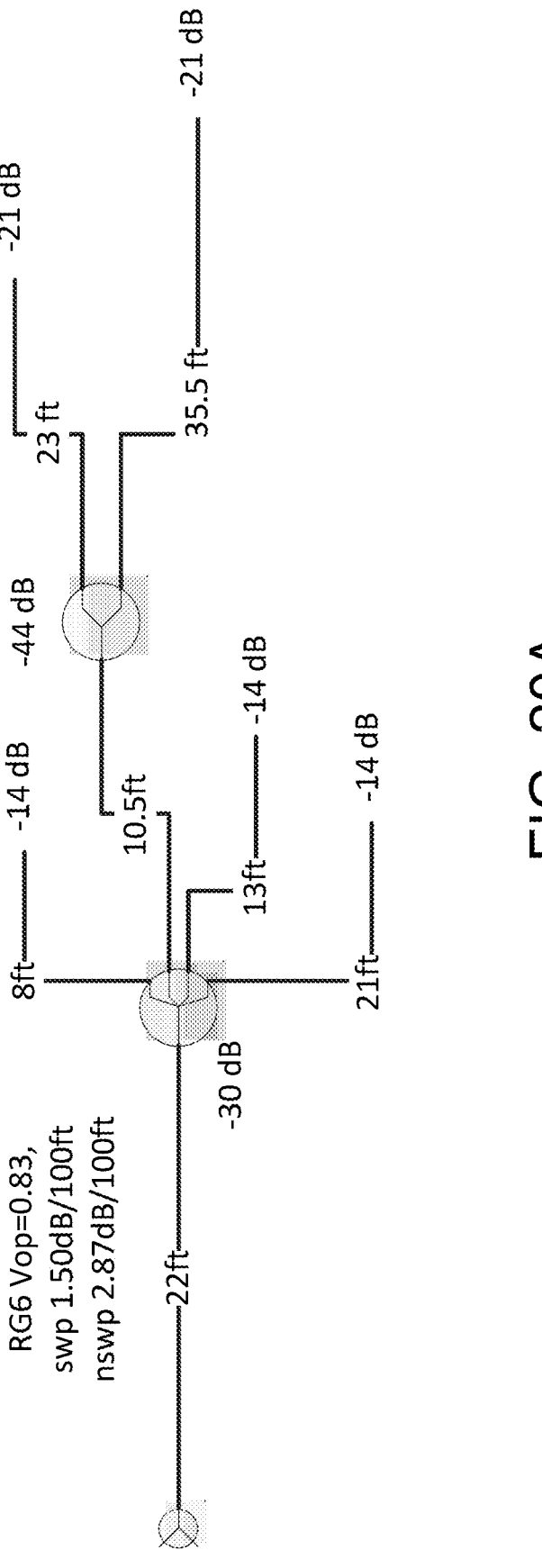
FIGS. 20A-20C illustrate a network configuration and measurement profiles for measuring a fault location in a cable network, according to an example.
Figure 20C:
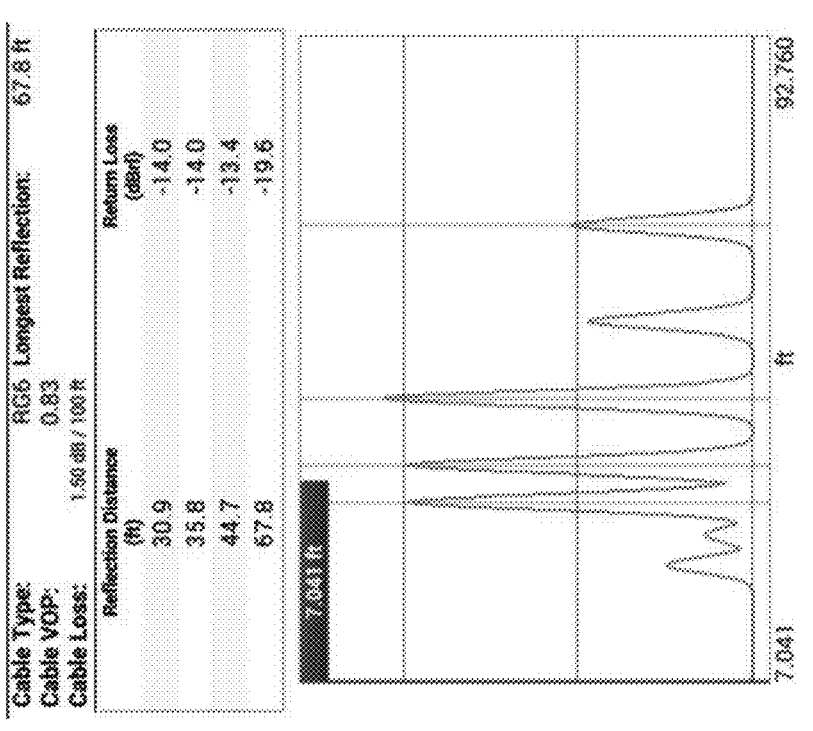
Figure 20B:
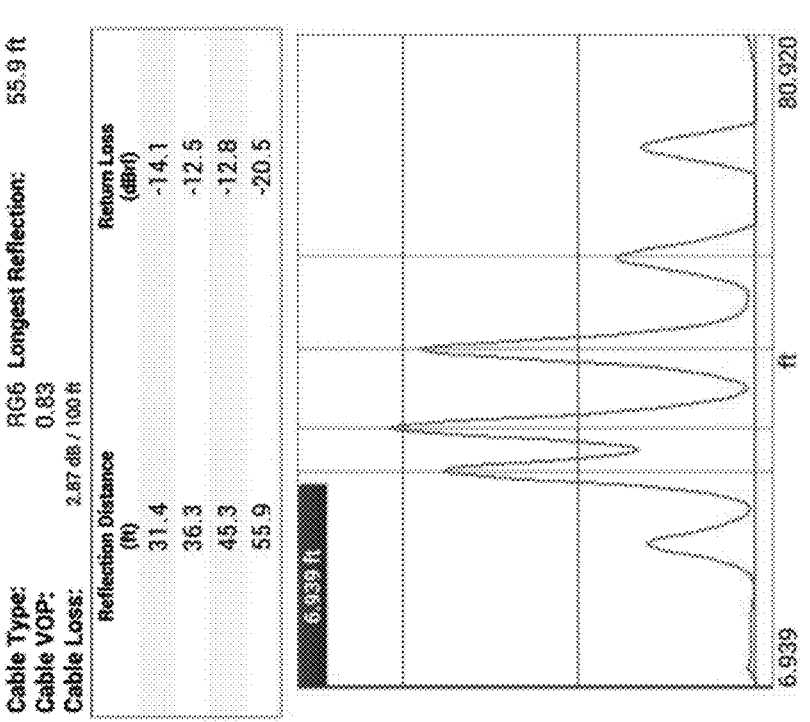

FIGS. 6A-20C illustrate various examples of network configuration and measurement profiles for measuring a fault location in a cable network. In each of these depicted examples and network configurations, the TDR waveforms acquired in-service by processing techniques described herein are nearly as accurate as those acquired out-of-service. Some figures do not include illustrative examples of network configurations because of its relative simplicity. For examples, FIGS. 17A-17B illustrate measurement profiles for a 50 ft. coaxial (open) cable, FIGS. 18A-18B illustrate measurement profiles for a 50 ft. coaxial (short) cable, and FIGS. 19A-19B illustrate measurement profiles for a 50 ft. coaxial cable with 9 dB (18 dB return loss). For illustrative purposes, particular attention will now be given to FIGS. 11A-11C, 12A-12C, and 17A-17B to show reliability and accuracy of the network configuration and measurement profiles for measuring a fault location in a cable network.

Figure 11A:
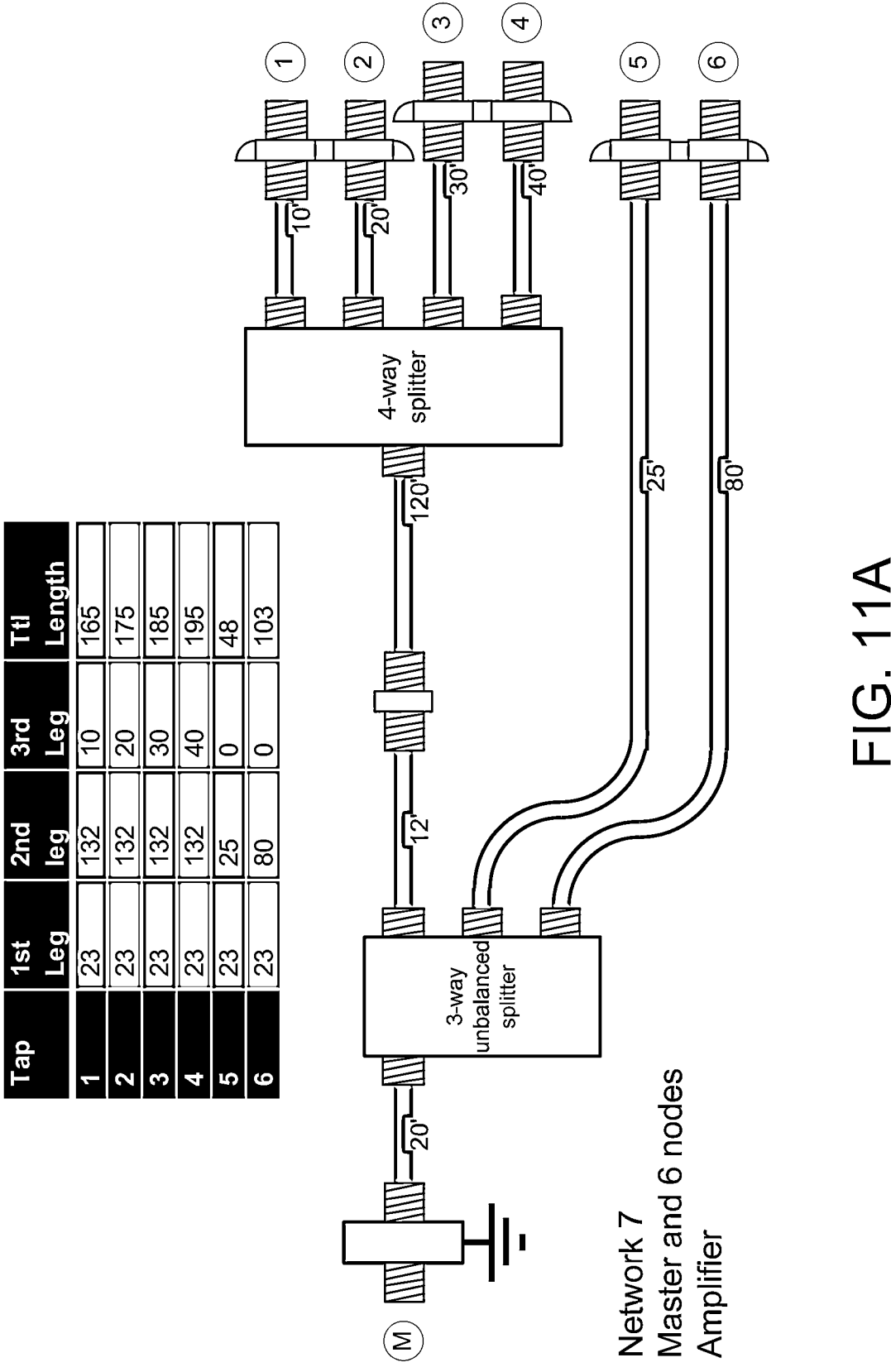
FIGS. 11A-11C illustrate a network configuration and measurement profiles for measuring a fault location in a cable network, according to an example.
Figure 11C:
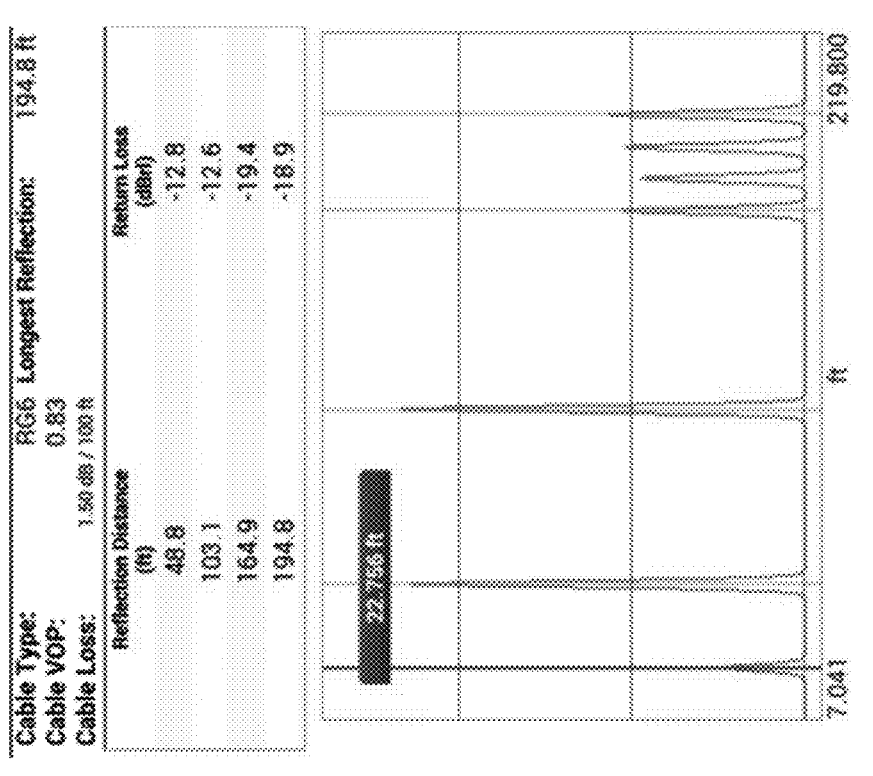
Figure 11B:
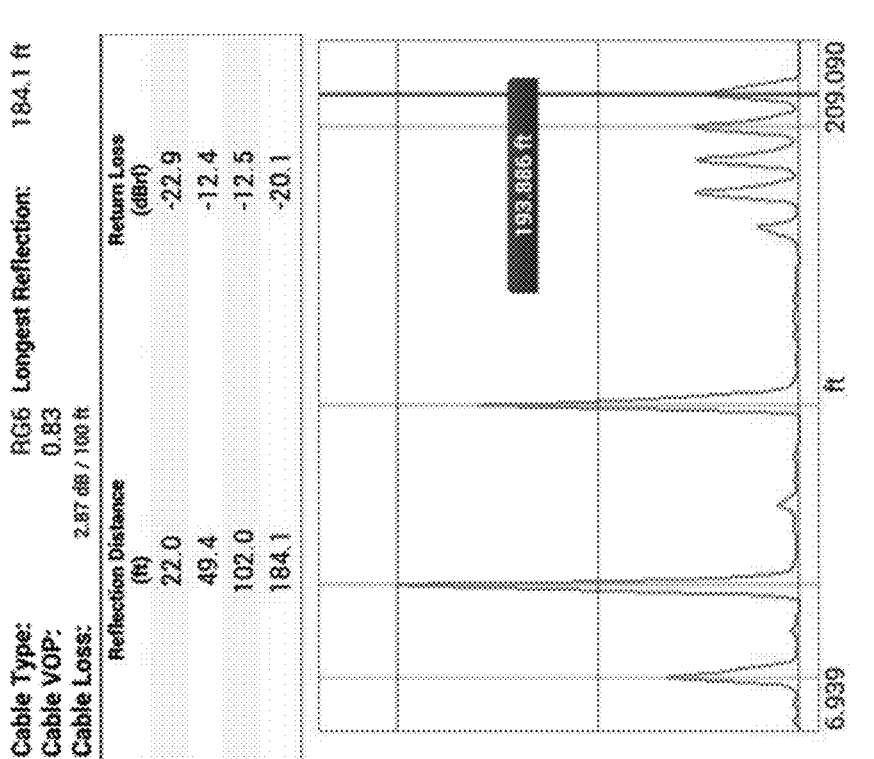

FIGS. 11A-11C illustrate a network configuration and measurement profiles for measuring a fault location in a cable network, according to an example. In FIG. 11A, a network configuration having a 20 ft. cable connected to a 2-way unbalanced splitter is shown. The 3-way unbalanced splitter is connected six (6) taps. This may be achieved by a 12 ft. cable plus a 120 ft. cable connected to a 4-way splitter, which is connected to a first tap via a 10 ft. cable, a second tap via a 20 ft. cable, a third tap via a 30 ft. cable, and a fourth tap via a 40 ft. cable. A fifth tap is connected to the 3-way unbalanced splitter via a 25 ft. cable, and a sixth tap via a 80 ft. cable, as shown. FIG. 11B illustrates a TDR waveform generated by an out-of-service measurement device. In FIG. 11B, the reflection distance shows a reflection distance of 49.4 ft., 102.0 ft., and 184.1 ft., which are very close to the actual distances of 48 ft. (fifth tap), 103 ft. (sixth tap), and 185 ft. (third tap), respectively.

FIG. 11C illustrates a TDR waveform using the high resolution processing techniques described herein for in-service measurements in the same network configuration of FIG. 11A. Here, the reflection distances are determined to be 48.8 ft. (fifth tap), 103.1 ft. (sixth tap), 164.9 ft. (first tap), and 194.8 ft. (fourth tap). The TDR waveform of FIG. 11C is more aligned with the out-of-service measurements and actual distances, illustrating accuracy and reliability of the high resolution processing techniques described herein.

Figure 12A:
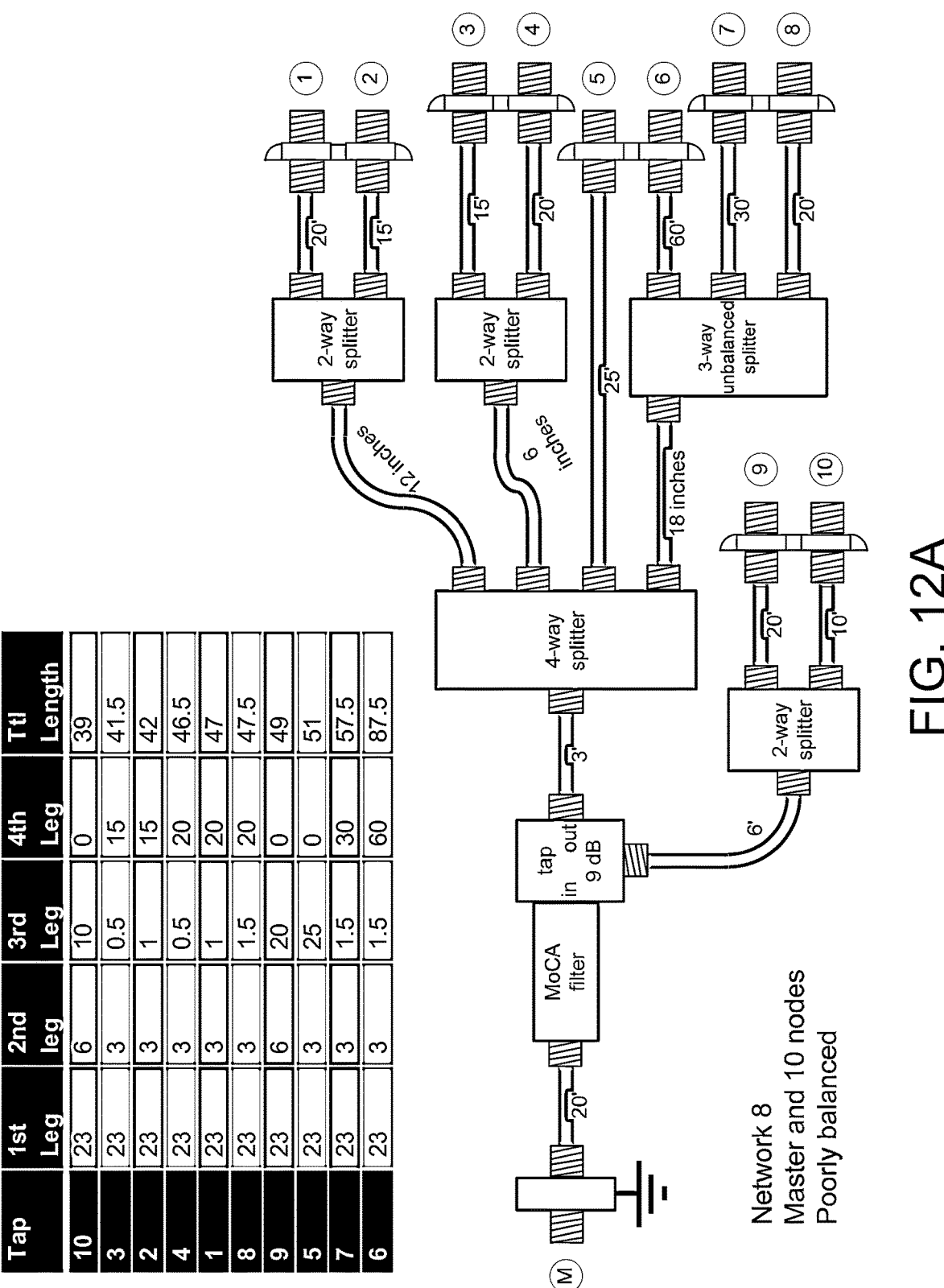
FIGS. 12A-12C illustrate a network configuration and measurement profiles for measuring a fault location in a cable network, according to an example.
Figures 12B, 12C:
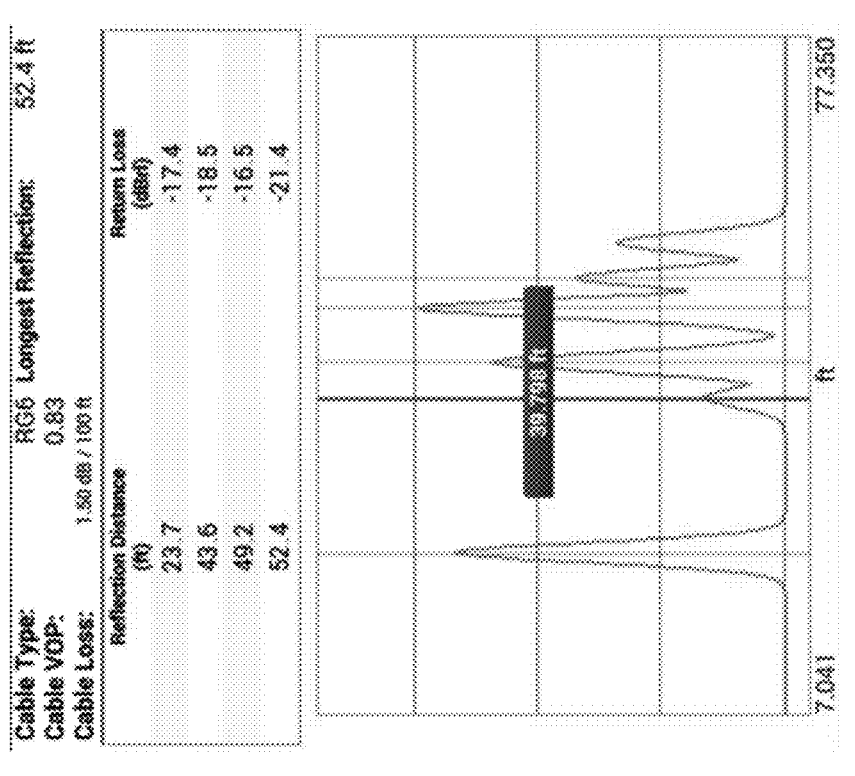
Figure 13A:
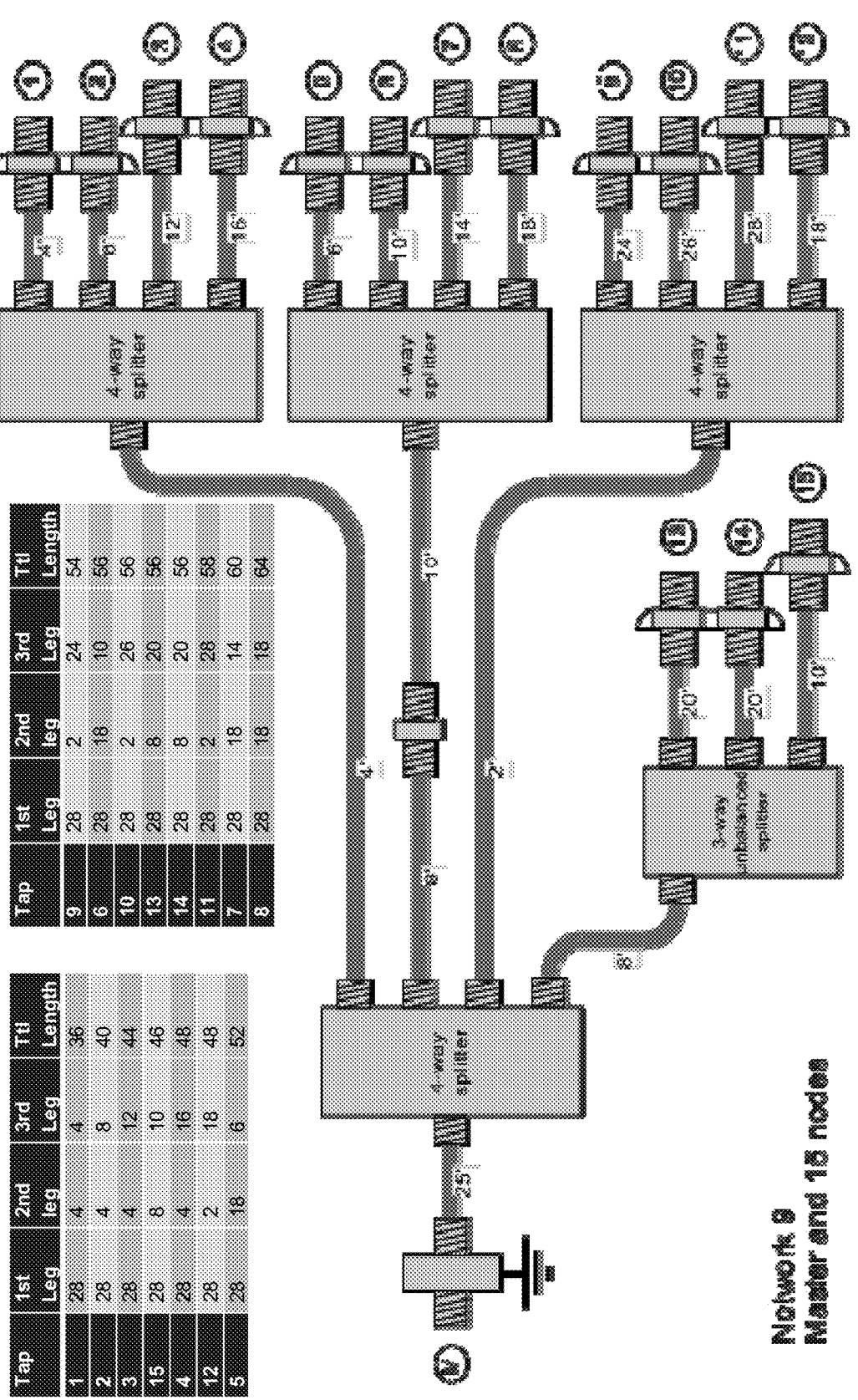
FIGS. 13A-13C illustrate a network configuration and measurement profiles for measuring a fault location in a cable network, according to an example.
Figure 13C:
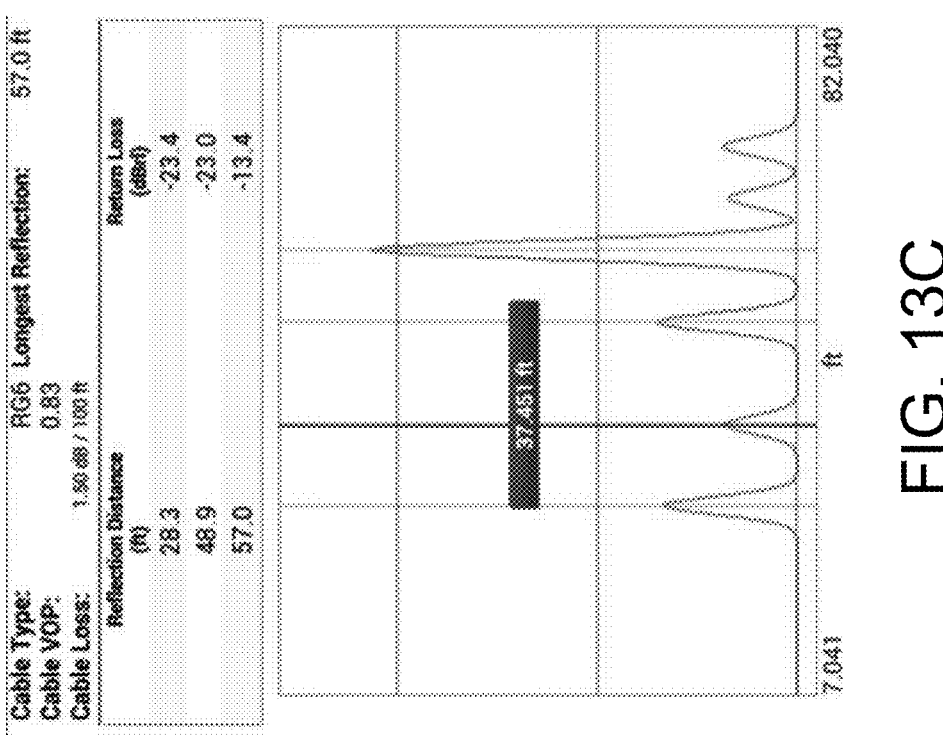
Figure 13B:
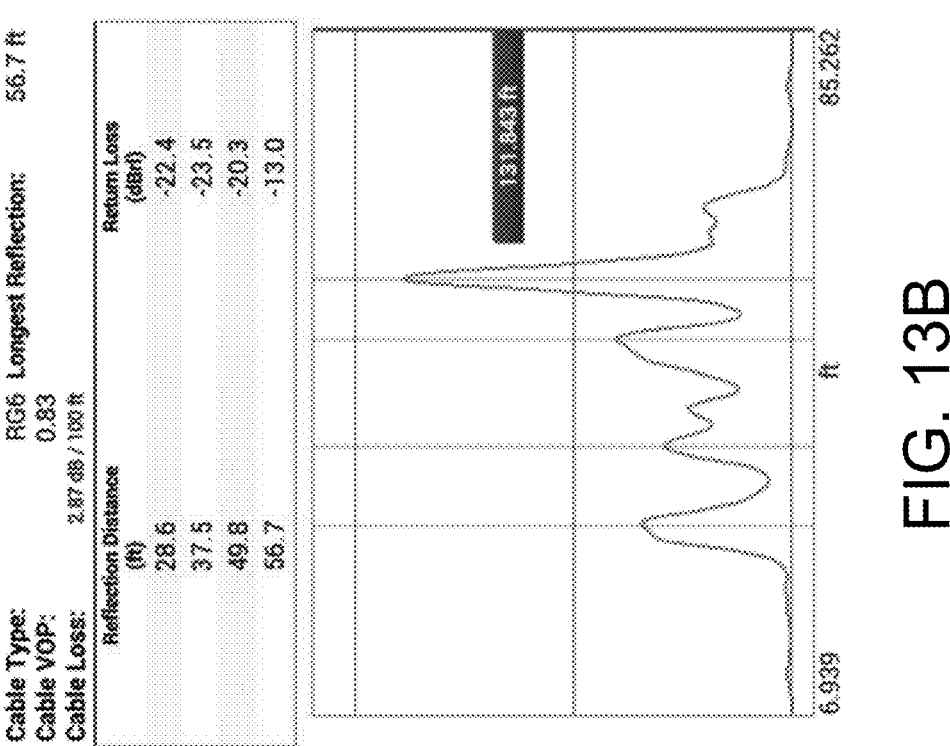
Figure 14A:
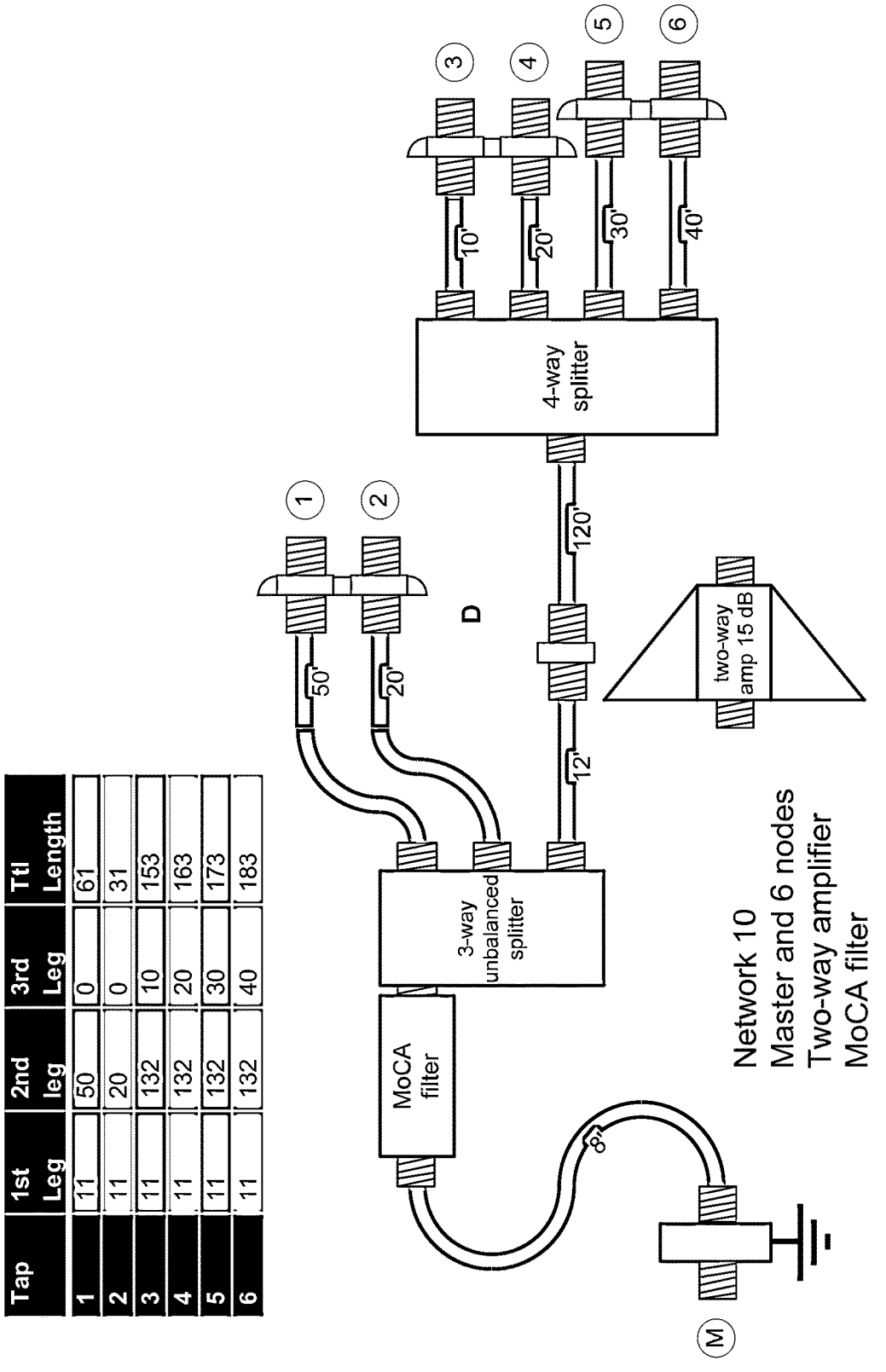
FIGS. 14A-14C illustrate a network configuration and measurement profiles for measuring a fault location in a cable network, according to an example.
Figures 14B, 14C:
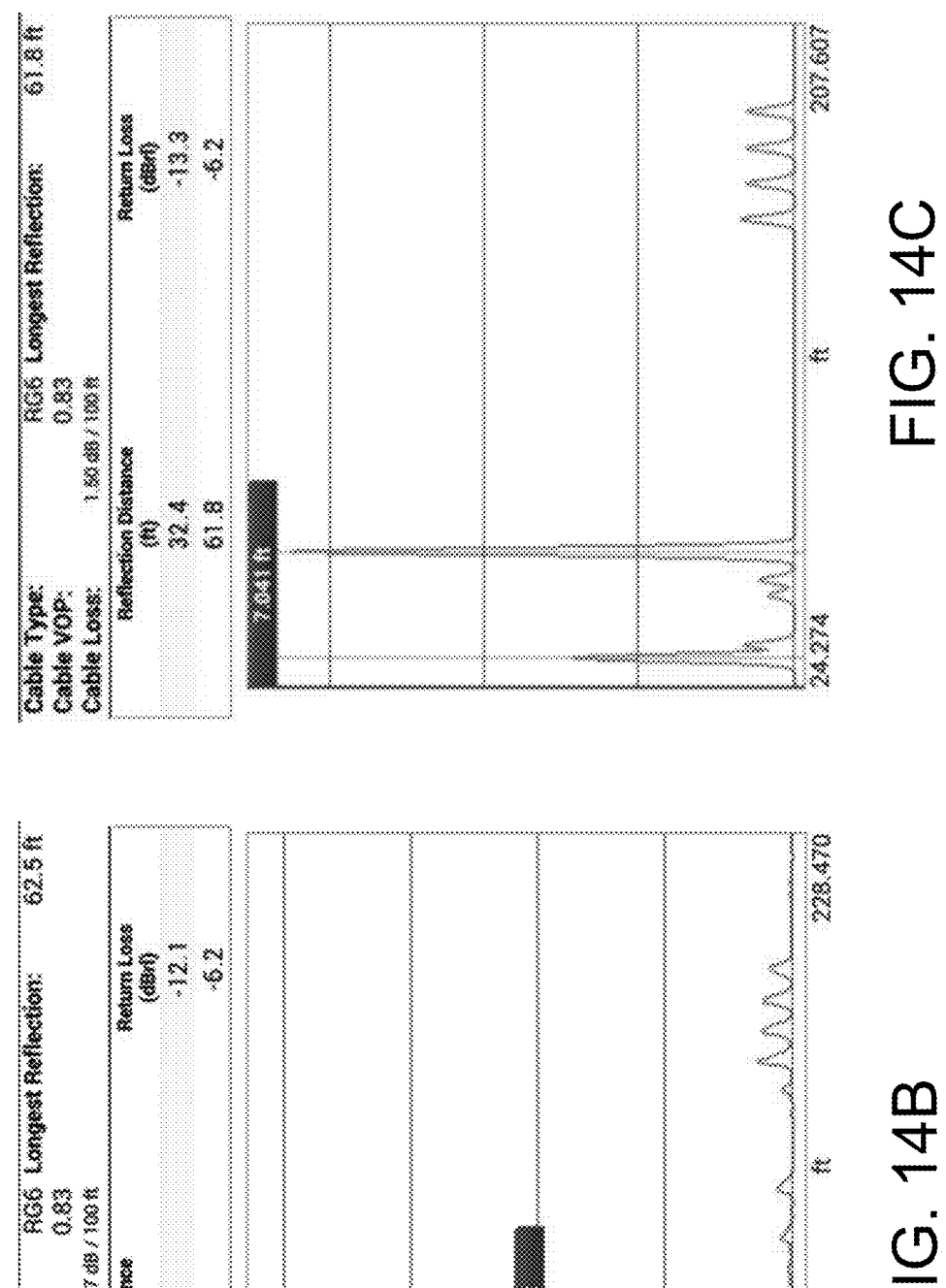
Figure 15A:
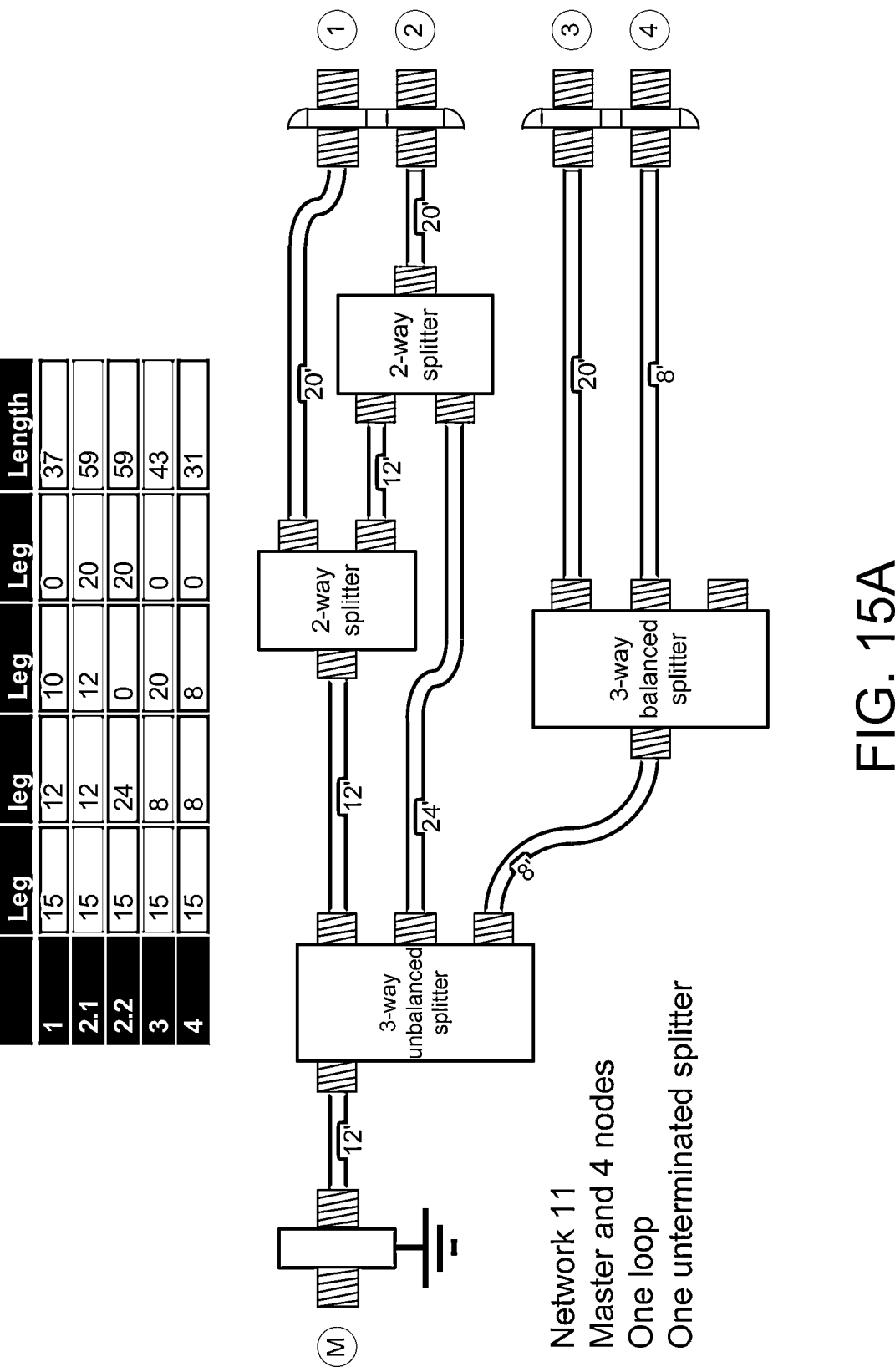
FIGS. 15A-15C illustrate a network configuration and measurement profiles for measuring a fault location in a cable network, according to an example.
Figure 15C:
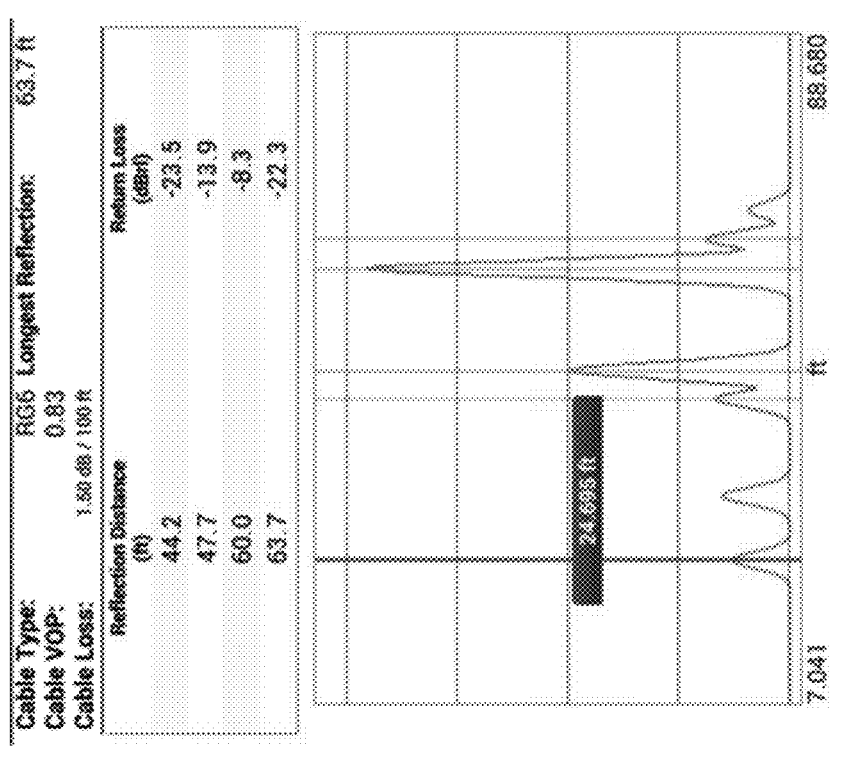
Figure 15B:
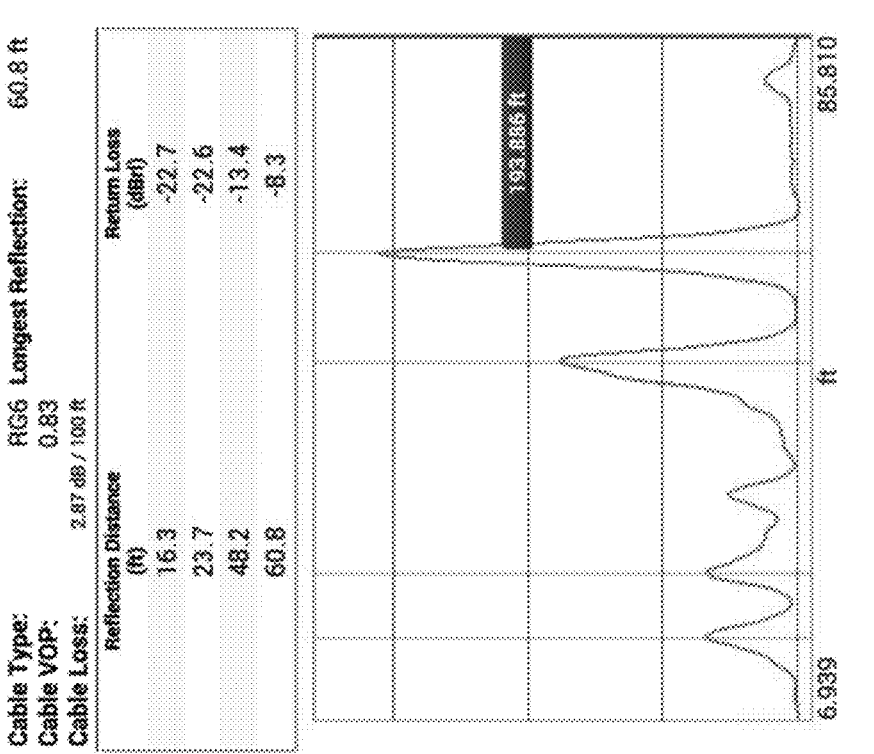
Figure 16A:
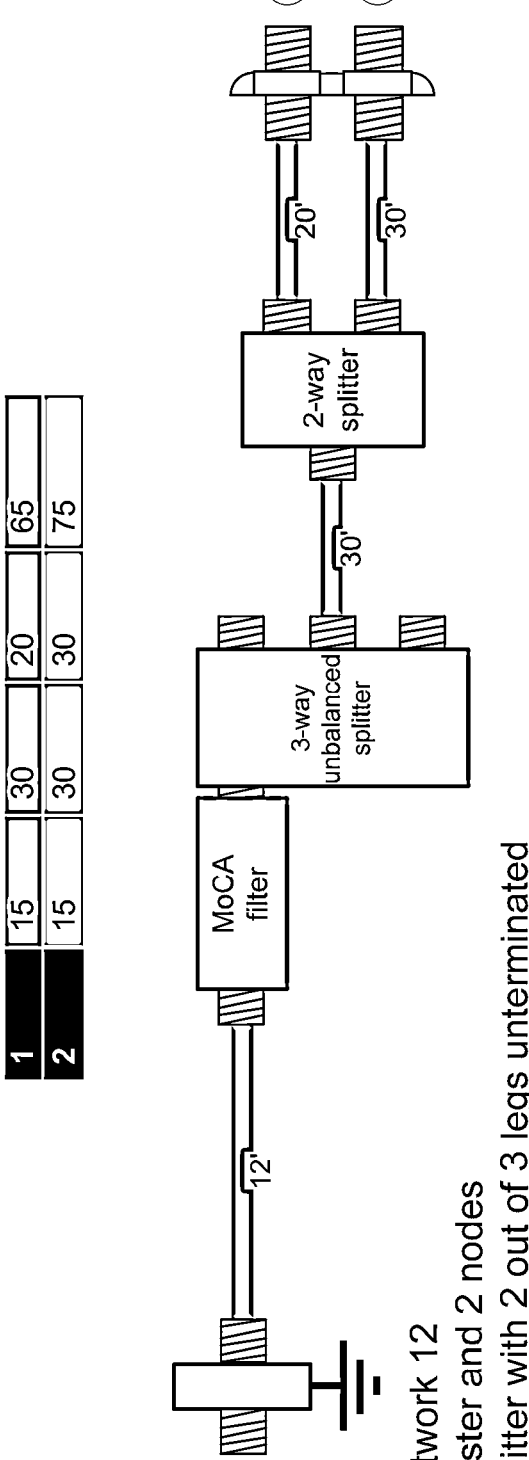
FIGS. 16A-16C illustrate a network configuration and measurement profiles for measuring a fault location in a cable network, according to an example.
Figure 16C:
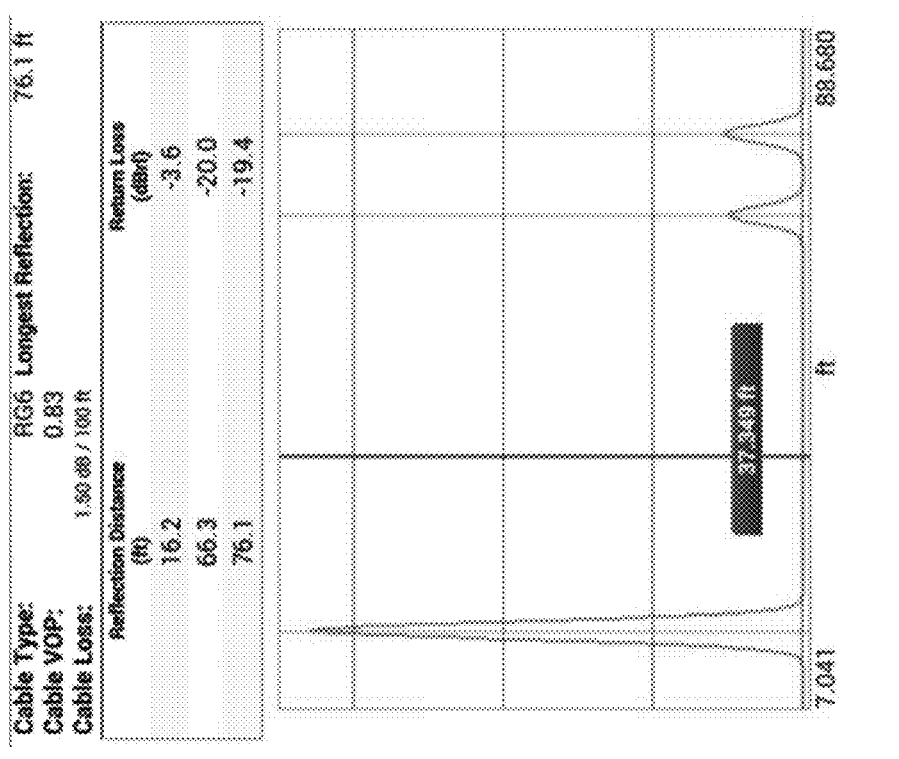
Figure 16B:
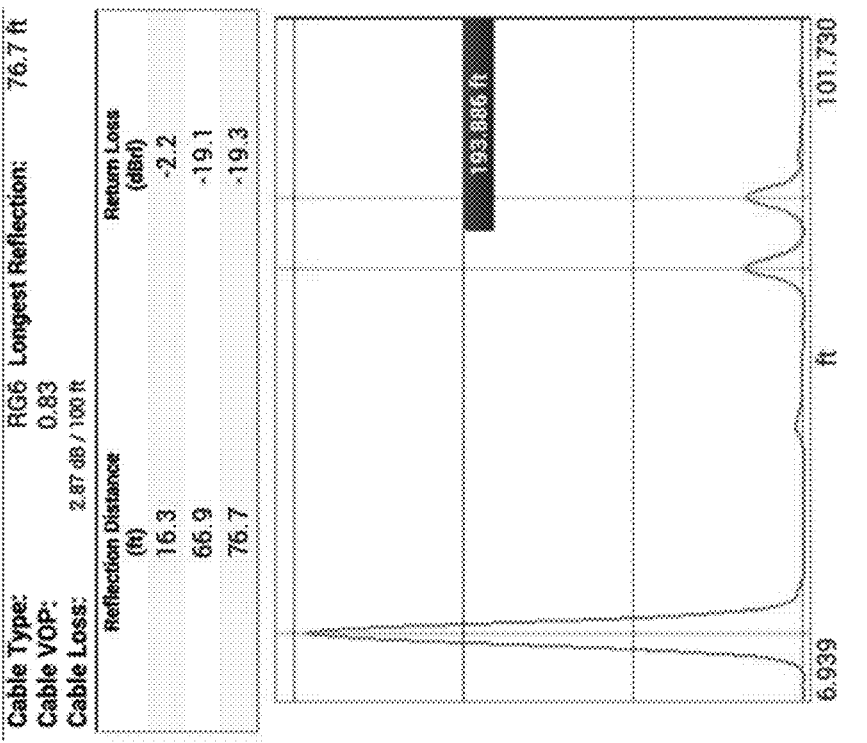

FIGS. 12A-12C illustrate a network configuration and measurement profiles for measuring a fault location in a cable network, according to an example. In FIG. 12A, a network configuration having a 20 ft. cable connected to a MoCA filter/tap is shown. The MoCA filter/tap then has a 3 ft cable connected to a 4-way splitter and a 6 ft cable connected to a 2-way splitter. The 4-way splitter is connected eight (8) taps, and the 2-way splitter is connected to two (2) taps. The relative distances are shown in the chart of FIG. 12A.

FIG. 12B illustrates a TDR waveform generated by an out-of-service measurement device. In FIG. 12B, the reflection distance shows a reflection distance of 44.5 ft. and 51.4 ft., which are very close to the actual distances of 42 ft. (second tap), and 51 ft. (fifth tap), respectively.

FIG. 12C illustrates a TDR waveform using the high resolution processing techniques described herein for in-service measurements in the same network configuration of FIG. 12A. Here, the reflection distances are determined to be 43.6 ft. (second tap), 49.2.1 ft. (ninth tap), and 52.4 ft. (fifth tap). The TDR waveform of FIG. 12C is more aligned with the out-of-service measurements and actual distances, illustrating accuracy and reliability of the high resolution processing techniques.

FIGS. 17A-17BC illustrate a measurement profiles for measuring a fault location in a cable network, according to an example. FIG. 17A illustrates a TDR waveform for a 50 ft. coaxial (open) cable generated by an out-of-service measurement device. Here, the reflection distance shows a reflection distance of 48.2 ft., which are very close to the actual distance of the cable. FIG. 17B illustrates a TDR waveform using the high resolution processing techniques described herein for in-service measurements for the same cable. Here, the reflection distance is determined to be 49.2 ft., which is even more aligned with the actual distance of the cable than the out-of-service measurement is, illustrating accuracy and reliability of the high resolution processing techniques.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

The invention claimed is:

1. A test instrument connectable to a cable television (CATV) network to provide a time domain reflectometry (TDR) in a fault location measurement, the test instrument comprising:

a port connectable to a test point of the CATV network; and a processing circuit to:

transmit, into the test point of the CATV network, a first TDR waveform having frequency-chirped probe pulses, wherein the frequency-chirped probe pulses are formed by an oscillatory signal that oscillates at a varying oscillation frequency to form a width of each pulse, and wherein, during the width of each pulse, the varying oscillation frequency of the oscillatory signal increases from a minimum frequency to a maximum frequency of a frequency band;

monitor to receive a first return signal of the frequency-chirped probe pulses;

use the first return signal to identify impedance changes at a fault location in the CATV network;

perform a first fault location measurement by transmitting the frequency-chirped probe pulses at a first sampling rate into the test point of the CATV network;

perform a first calibration measurement by transmitting the frequency-chirped probe pulses at the first sampling rate into a closed calibration circuit within the test instrument; and perform a second fault location measurement at a second sampling rate and a second calibration measurement at the second sampling rate that is higher than the first sampling rate.

2. The test instrument of claim 1, wherein the processing circuit is further to:

determine a distance from the test point to the fault location in the CATV network based on a measure of time elapsed between the transmitting of the first TDR waveform and the receiving of the first return signal, and a speed of propagation of the frequency-chirped probe pulses in the CATV network.

3. The test instrument of claim 1, wherein the processing circuit is further to:

determine a resolution of the frequency-chirped probe pulses based on a propagation speed of the frequency-chirped probe pulses in the CATV network and a value of the frequency band between the maximum frequency and the minimum frequency.

4. The test instrument of claim 1, wherein the processing circuit is further to:

generate an identification of the fault location in the CATV network to an output.

5. The test instrument of claim 1, wherein the processing circuit is further to:

cross-correlate the second fault location measurement at the second sampling rate with the second calibration measurement at the second sampling rate to generate a cross-correlation TDR waveform;

generate a new TDR waveform using a refinement processing technique to remove echoes from the cross-correlation TDR waveform; and provide the new TDR waveform to an output, wherein the new TDR waveform is a high resolution TDR waveform associated with the fault location in the CATV network.

6. The test instrument of claim 5, wherein the processing circuit is to:

filter out artifacts during the performance of the second calibration measurement.

7. The test instrument of claim 5, wherein the refinement processing technique comprises:

identifying a highest peak in the cross-correlation TDR waveform;

determining a time value and an amplitude of the highest peak;

converting the time value that corresponds with the highest peak into a delay factor;

delaying the second calibration measurement by the delay factor; and scaling the second fault location measurement by the delayed second calibration measurement by a specific correlation.

8. A method for providing a time domain reflectometry (TDR) in a fault location measurement in a cable television (CATV) network, comprising:

transmitting, by a processor of a test instrument, a first TDR waveform having frequency-chirped probe pulses into a test point of the CATV network, wherein the frequency-chirped probe pulses are formed by an oscillatory signal that oscillates at a varying oscillation frequency to form a width of each pulse, and wherein, during the width of each pulse, the varying oscillation frequency of the oscillatory signal increases from a minimum frequency to a maximum frequency of a frequency band;

monitoring, by the processor, to receive a first return signal of the frequency-chirped probe pulses;

using, by the processor, the first return signal to identify impedance changes at a fault location in the CATV network;

performing, by the processor, a first fault location measurement by transmitting the frequency-chirped probe pulses at a first sampling rate into the test point of the CATV network;

performing, by the processor, a first calibration measurement by transmitting the frequency-chirped probe pulses at the first sampling rate into a closed calibration circuit within the test instrument; and performing, by the processor, a second fault location measurement at a second sampling rate and a second calibration measurement at the second sampling rate that is higher than the first sampling rate.

9. The method of claim 8, further comprising:

determining a distance from the test point to the fault location in the CATV network based on a measure of time elapsed between the transmitting of the first TDR waveform and the receiving of the first return signal, and a speed of propagation of the frequency-chirped probe pulses in the CATV network.

10. The method of claim 8, further comprising:

determining a resolution of the frequency-chirped probe pulses based on a propagation speed of the frequency-chirped probe pulses in the CATV network and a value of the frequency band between the maximum frequency and the minimum frequency.

11. The method of claim 8, further comprising:

generating an identification of the fault location in the CATV network to an output.

12. The method of claim 8, further comprising:

cross-correlating the second fault location measurement at the second sampling rate with the second calibration measurement at the second sampling rate to generate a cross-correlation TDR waveform;

generating a new TDR waveform using a refinement processing technique to remove echoes from the cross-correlation TDR waveform; and providing the new TDR waveform to an output, wherein the new TDR waveform is a high resolution TDR waveform associated with the fault location in the CATV network.

13. The method of claim 12, further comprising:

storing the first calibration measurement and the second calibration measurement in a memory.

14. The method of claim 12, further comprising:

filtering out artifacts during the performance of the second calibration measurement.

15. The method of claim 12, wherein the refinement processing technique comprises:

identifying a highest peak in the cross-correlation TDR waveform;

determining a time value and an amplitude of the highest peak;

converting the time value that corresponds with the highest peak into a delay factor;

delaying the second calibration measurement by the delay factor; and scaling the second fault location measurement by the delayed second calibration measurement by a specific correlation.

16. A non-transitory computer-readable storage medium storing instructions that, when executed by a processor of a test instrument, cause the processor to:

transmit a first time domain reflectometry (TDR) waveform having frequency-chirped probe pulses into a test point of a cable television (CATV) network, wherein the frequency-chirped probe pulses are formed by an oscillatory signal that oscillates at a varying oscillation frequency to form a width of each pulse, and wherein, during the width of each pulse, the varying oscillation frequency of the oscillatory signal increases from a minimum frequency to a maximum frequency of a frequency band;

monitor to receive a first return signal of the frequency-chirped probe pulses;

use the first return signal in a TDR technique to identify impedance changes at a fault location in the CATV network;

perform a first fault location measurement by transmitting the frequency-chirped probe pulses at a first sampling rate into the test point of the CATV network;

perform a first calibration measurement by transmitting the frequency-chirped probe pulses at the first sampling rate into a closed calibration circuit within the test instrument; and perform a second fault location measurement at a second sampling rate and a second calibration measurement at the second sampling rate that is higher than the first sampling rate.

17. The non-transitory computer-readable storage medium of claim 16, wherein the instructions further cause the processor to:

determine a distance from the test point to the fault location in the CATV network based on a measure of time elapsed between the transmitting of the first TDR waveform and the receiving of the first return signal, and a speed of propagation of the frequency-chirped probe pulses in the CATV network.

18. The non-transitory computer-readable storage medium of claim 16, wherein the instructions further cause the processor to:

determine a resolution of the frequency-chirped probe pulses based on a propagation speed of the frequency-chirped probe pulses in the CATV network and a value of the frequency band between the maximum frequency and the minimum frequency.

19. The non-transitory computer-readable storage medium of claim 16, wherein the instructions further cause the processor to:

cross-correlate the second fault location measurement at the second sampling rate with the second calibration measurement at the second sampling rate to generate a cross-correlation TDR waveform;

generate a new TDR waveform using a refinement processing technique to remove echoes from the cross-correlation TDR waveform; and provide the new TDR waveform to an output, wherein the new TDR waveform is a high resolution TDR waveform associated with the fault location in the CATV network.

20. The non-transitory computer-readable storage medium of claim 19, wherein the refinement processing technique comprises:

identifying a highest peak in the cross-correlation TDR waveform;

determining a time value and an amplitude of the highest peak;

converting the time value that corresponds with the highest peak into a delay factor;

delaying the second calibration measurement by the delay factor; and scaling the second fault location measurement by the delayed second calibration measurement by a specific correlation.

\* \* \* \* \*